(12) United States Patent
Davies et al.

(10) Patent No.: US 8,570,047 B1
(45) Date of Patent: Oct. 29, 2013

(54) BATTERY FAULT DETECTION WITH SATURATING TRANSFORMERS

(75) Inventors: Francis J. Davies, Friendswood, TX (US); Jason R. Graika, Bloomington, MN (US)

(73) Assignee: The United States of America as represented by the Administrator of the National Aeronautics and Space Administration, Washington, DC (US)

( * ) Notice: Subject to any disclaimer, the term of this patent is extended or adjusted under 35 U.S.C. 154(b) by 539 days.

(21) Appl. No.: 12/855,384

(22) Filed: Aug. 12, 2010

Related U.S. Application Data

(63) Continuation-in-part of application No. 12/370,021, filed on Feb. 12, 2009, now Pat. No. 8,183,870.

(51) Int. Cl.
*G01N 27/416* (2006.01)
*H02J 3/00* (2006.01)
*G08B 21/00* (2006.01)

(52) U.S. Cl.
USPC ......... 324/434; 324/426; 324/427; 324/429; 324/430; 307/17; 307/83; 340/646; 340/636.2

(58) Field of Classification Search
CPC ................................................ G01R 31/3658
USPC .......................................................... 324/434
See application file for complete search history.

(56) References Cited

U.S. PATENT DOCUMENTS

| | | | |
|---|---|---|---|
| 4,217,645 A | 8/1980 | Barry et al. | |
| 4,697,134 A | 9/1987 | Burkum et al. | |
| 4,956,739 A | 9/1990 | Becker et al. | |
| 5,254,930 A | 10/1993 | Daly | |
| 5,390,064 A | 2/1995 | Russo | |
| 5,656,931 A | 8/1997 | Lau et al. | |
| 5,659,237 A | 8/1997 | Divan et al. | |
| 5,839,093 A | 11/1998 | Novosel et al. | |
| 5,923,148 A | 7/1999 | Sideris et al. | |
| 5,969,625 A | 10/1999 | Russo | |
| 6,002,260 A | 12/1999 | Lau et al. | |
| 6,018,239 A | 1/2000 | Berkcan et al. | |
| 6,133,724 A | 10/2000 | Schweitzer et al. | |
| 6,711,512 B2 | 3/2004 | Noh | |
| 6,844,799 B2 | 1/2005 | Attarian et al. | |
| 6,915,220 B2 | 7/2005 | Cardinal et al. | |
| 6,963,197 B1 | 11/2005 | Feight et al. | |
| 7,315,169 B1 | 1/2008 | Fenske et al. | |
| 7,425,832 B2 | 9/2008 | Gopal et al. | |
| 7,489,048 B2 | 2/2009 | King et al. | |
| 8,120,322 B2* | 2/2012 | Lee et al. | 320/118 |
| 2006/0109012 A1* | 5/2006 | Foreman et al. | 324/700 |
| 2009/0085553 A1* | 4/2009 | Kumar et al. | 323/351 |

* cited by examiner

*Primary Examiner* — Drew A Dunn
*Assistant Examiner* — Nathaniel Pelton
(74) *Attorney, Agent, or Firm* — Theodore U. Ro

(57) ABSTRACT

A battery monitoring system utilizes a plurality of transformers interconnected with a battery having a plurality of battery cells. Windings of the transformers are driven with an excitation waveform whereupon signals are responsively detected, which indicate a health of the battery. In one embodiment, excitation windings and sense windings are separately provided for the plurality of transformers such that the excitation waveform is applied to the excitation windings and the signals are detected on the sense windings. In one embodiment, the number of sense windings and/or excitation windings is varied to permit location of underperforming battery cells utilizing a peak voltage detector.

17 Claims, 28 Drawing Sheets

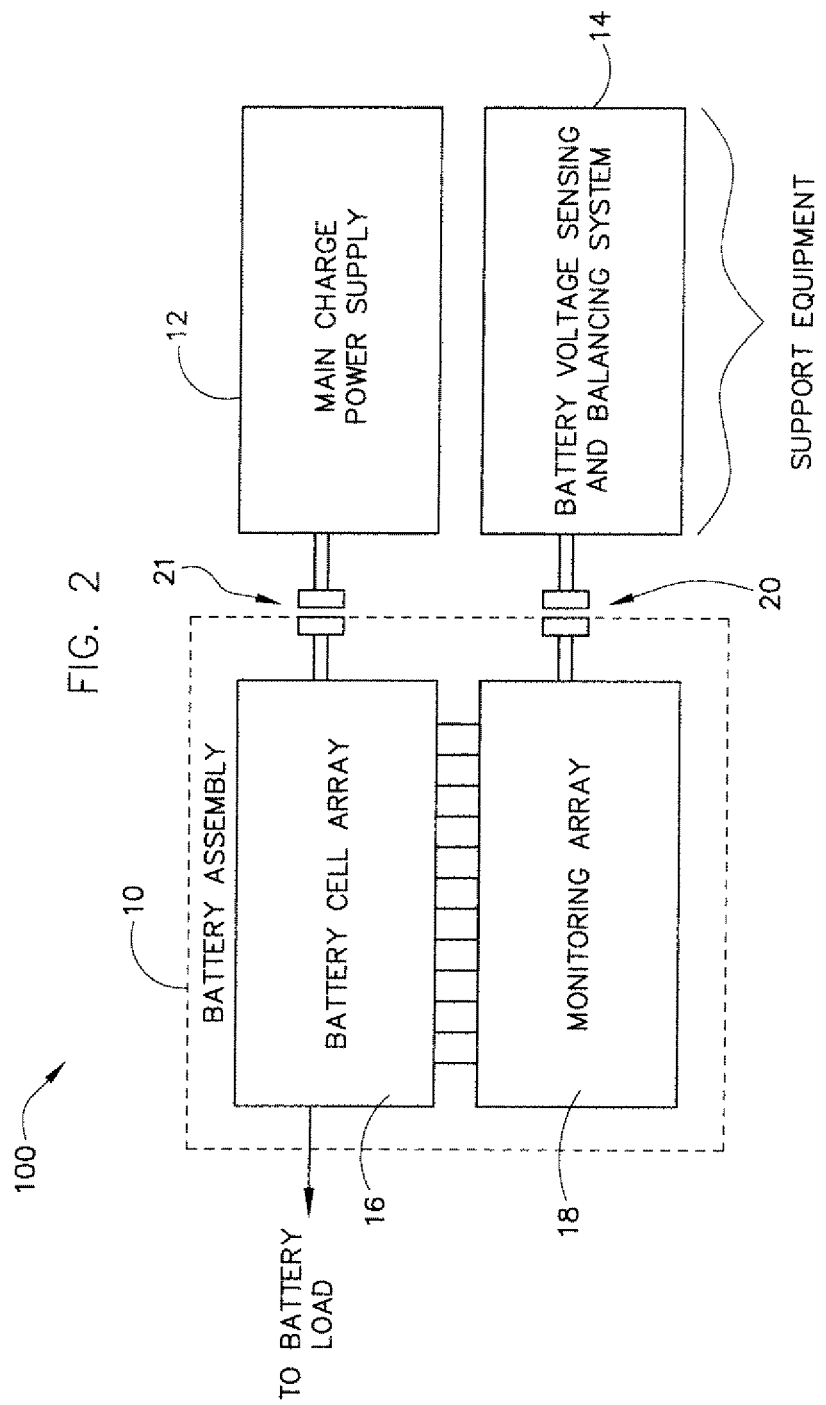

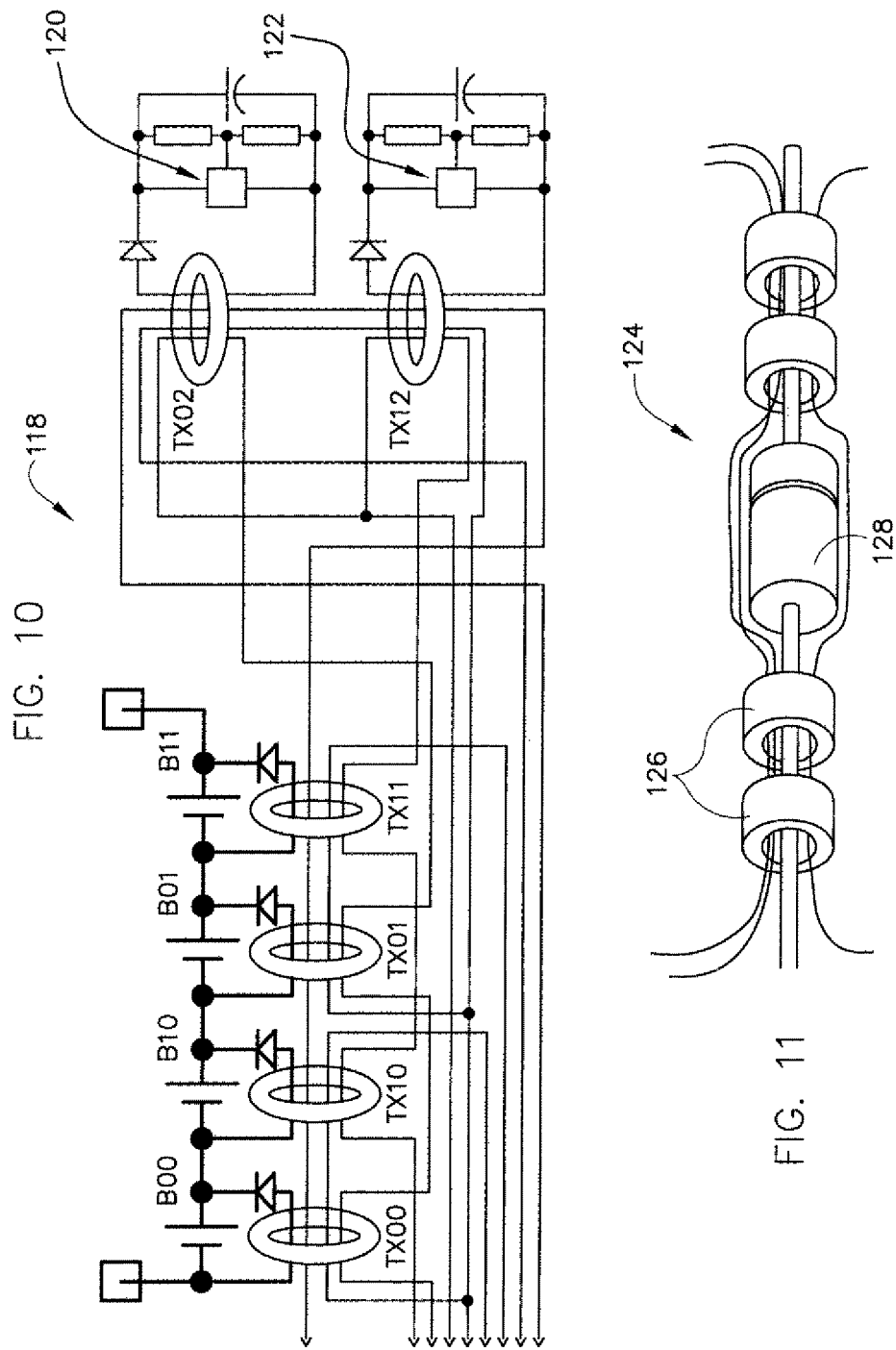

|    | FAULT ON S1 | FAULT ON S2 | FAULT ON S3 | FAULT ON S4 | FAULT ON S5 | FAULT ON S6 | FAULT ON S7 | FAULT ON S8 | NO FAULT |
|----|---|---|---|---|---|---|---|---|---|
| V1 | + | + | + | 0 | 0 | − | − | − | 0 |
| V2 | + | 0 | − | + | − | + | 0 | − | 0 |

FIG. 29

BATTERY FAULT DETECTION WITH SATURATING TRANSFORMERS

This application is a continuation-in-part application of U.S. patent application Ser. No. 12/370,021 filed Feb. 12, 2009 now U.S. Pat. No. 8,183,870, which is incorporated herein by reference.

ORIGIN OF THE INVENTION

The invention described herein was made by employee(s) of the United States Government and may be manufactured and used by or for the Government of the United States of America for governmental purposes without the payment of any royalties thereon or therefore.

BACKGROUND OF THE INVENTION

1. Field of the Invention

The present invention relates generally to battery cell monitoring and, in one possible embodiment, to a lightweight monitoring network with minimal connections that may be utilized to monitor the health of individual battery cells in multi-cell batteries and/or groups of battery cells.

2. Description of Related Art

High voltage batteries may involve connections of many cells or cell modules. Examples of high voltage batteries include battery cell arrays for hybrid cars, aerospace/spacecraft applications, telecommunication power supplies, computer power supplies, uninterruptible power supplies, electric utility energy storage, commercial applications, and the like. High voltage batteries may be of different types including lithium-ion cells, fuel cells, other electrochemical cells, and the like.

In prior art systems, some of which are discussed hereinafter, cell monitoring and/or balancing are achieved either by including complex electronic circuitry at each cell, or electrical connectors with many contacts to allow external circuitry to monitor and balance the cells. Complicated circuitry at each cell is inherently less reliable. If many connections are required, the connectors present electrical shock safety issues. If the connectors are heavy, then they may be unsuitable for aerospace/spacecraft applications.

For some applications, it may be desirable to provide separate battery system components such as an external charger and an external cell charge measurement subsystem. To provide the capability to monitor individual battery cells, a multi-pin connector on the battery is then required. In large high voltage batteries, such a connector has several disadvantages. The connector needs at least one pin per cell. Because the battery can produce high voltages, the sense lines need a safety disconnect or electrical isolation to avoid exposing ground personnel or crew to high voltages when the connector is used. As well, because the battery can produce high currents, the sense lines may also need some sort of fusing or other wire protection as well.

Batteries may utilize different numbers of individual cells depending on the requirements of the system. For example, batteries may have a few cells, thirty or more cells, over one hundred cells, or more. Thus, the number of connections necessary to provide access to individual cells may be quite large.

The following patents show prior art efforts regarding the above and other problems:

U.S. Pat. No. 7,489,048, issued Feb. 10, 2009, to King et al, discloses a battery load leveling system for an electrically powered system in which a battery is subject to intermittent high current loading, the system including a first battery, a second battery, and a load coupled to the batteries. The system includes a passive storage device, a unidirectional conducting apparatus coupled in series electrical circuit with the passive storage device and poled to conduct current from the passive storage device to the load, a series electrical circuit coupled in parallel with the battery such that the passive storage device provides current to the load when the battery terminal voltage is less than voltage on the passive storage device, and a battery switching circuit that connects the first and second batteries in either a lower voltage parallel arrangement or a higher voltage series arrangement.

U.S. Pat. No. 7,425,832, issued Sep. 16, 2008, to Gopal et al, discloses a method and system for measuring impedance and voltage characteristics of individual cells of multi-cell electrochemical devices, for example a battery or a fuel cell stack. The electrochemical system comprises a plurality of cells; a measuring device including a plurality of inputs connected across the plurality of cells to generate voltage and current signals indicative of voltage and current characteristics of the plurality of cells; a current supply/draw means for superimposing modulated current values through the plurality of cells; and a controller for controlling at least one system operating condition based on the voltage and current characteristics received from the measuring device, the controller being connected to the measuring device. The method comprises (a) superimposing modulated current values across a plurality of cells of the electrochemical device; (b) drawing current from the plurality of cells to generate voltage and current signals indicative of voltage and current characteristics of the plurality of cells; and, (c) controlling the at least one system operating condition based on the voltage and current characteristics of the plurality of cells, wherein the at least one system operating condition comprises at least one of temperature, humidity and reactant flow rates, within the electrochemical system.

U.S. Pat. No. 7,315,169, issued Jan. 1, 2008, to Fenske et al, discloses a fault indicator for indicating the occurrence of a fault in an electrical conductor that has a housing, a high capacity battery, at least one light emitting diode (LED) visible from the exterior of the fault indicator upon the occurrence of a fault, which may be automatically reset to a non-fault indicating position a predetermined time after the occurrence of the fault, and electronic circuitry for sensing a fault, for actuating the LEDs to indicate a fault and for resetting the LEDs to a non-fault indicating condition a predetermined time after the fault has occurred. The electronic circuitry conserves energy by drawing insubstantial current from the high capacity battery during non-fault conditions. The electronic circuitry may also include in-rush restraint to avoid false tripping of the fault indicator during surges. An inrush restraint circuit has an output signal that is logically combined with a fault indicator signal to disable the fault indicator during inrush conditions. An improved electrostatic sensor senses the electromagnetic field associated with a monitored conductor, provides less susceptibility to affects from adjacent conductors and provides operating power to the inrush restraint circuitry.

U.S. Pat. No. 6,963,197, issued Nov. 8, 2005, to Feight et al, discloses a fault indicator for indicating the occurrence of a fault in an electrical conductor that is reset at a predetermined time after the fault is detected, such as about 4 hours. The fault indicator has a housing, a high capacity battery, a fault sensor, a display for indicating a fault condition, and a programmable controller with a sleep state that draws low quiescent current. As a result, the battery is expected to last the lifetime of the fault indicator. The fault indicator may optionally include current inrush restraint and/or voltage inrush restraint to inhibit the controller from activating the display to the fault indicating condition during the inrush conditions. The electromagnetic field about the conductor causes an electrostatic sensor to develop a differential voltage signal between two electrodes of different areas for the voltage in rush restraint circuit. Auxiliary contacts are provided to remotely monitor the fault indicator.

U.S. Pat. No. 6,915,220, issued Jul. 5, 2005, to Cardinal et al, discloses an integrated battery monitoring device that includes a pair of input leads for coupling across the terminals of a battery cell to be monitored and a sensor for sensing a desired battery cell parameter. A self-contained power supply has the voltage across the battery cell terminals as an input thereto, the self-contained power supply being configured for providing power to the sensor. A pair of output leads communicates data generated by the sensor.

U.S. Pat. No. 6,844,799, issued Jan. 18, 2005, to Attarian et al, discloses a current sensor and current transformer for monitoring electrical current with a magnetic core having a mixture of magnetic materials to provide a low cost design in a compact configuration with an expanded dynamic range. The mixed material core can be fabricated either from stamped laminations or from coil stock and may include an air gap for activating a magnetic flux sensor. Multiple core configurations are disclosed.

U.S. Pat. No. 6,711,512, issued Mar. 23, 2004, to Noh, discloses a pole transformer load monitoring system using a wireless Internet network. The load monitoring system is capable of measuring, in real time, a variety of load parameters (phase voltages, phase currents and temperatures) of a pole transformer placed on a distribution line. The results of the measurements are transferred to an operator in a branch operating station over the wireless Internet network so as to prevent fosses resulting from overloaded and unbalanced states.

U.S. Pat. No. 6,133,724, issued Oct. 17, 2000, to Schweitzer, Jr. et al, discloses a fault indicator contained within a protective equipment closure of the type used to house pad-mounted components of a power distribution system detects the occurrence of a fault current in a monitored conductor and provides a light indication thereof. The fault indicator includes a circuit monitoring module, having an integral fault indicator flag module, and a remote fault indicator light module. A status-indicating flag is rotatably mounted in the integral fault indicator flag module. The flag is positioned in either a reset indicating position or a fault indicating position by a magnetic pole piece, which is magnetized in one magnetic direction or the other by momentary application of a current in one direction or the other to an actuator winding on the pole piece. A magnetically actuated reed switch in an auxiliary magnetic circuit comprising an auxiliary pole piece magnetized by the actuator winding and a bias magnet magnetically aligned to oppose the reset magnetic orientation and reinforce the trip magnetic orientation of the magnetic pole piece closes upon occurrence of the fault current to connect an internal battery to an LED contained within the remote fault indicator light module so that the LED is visible from the exterior of the protective equipment enclosure. The light indication of the fault occurrence may be reset automatically by a timed reset circuit or manually by a manual reset circuit.

U.S. Pat. No. 6,018,239, issued Jan. 25, 2000, to Berkcan et al, discloses a self-powered axial current sensor for generating a signal which represents current in a power line includes, in one embodiment, a housing having a bus bar opening of substantially rectangular shape extending longitudinally therethrough. The housing also includes current sensor core retaining walls which define a current sensor region, and a cover base wall which defines, with one of the retaining walls, a power core region. A current sensor core and coil are located in the current sensor region and are positioned proximate the bus bar opening. The current sensor core and coil also are substantially symmetrical with respect to the center axis of the bus bar opening. The current sensor further includes a power core and a power coil located in the power core region and positioned substantially symmetrically with respect to the center axis of bus bar opening.

U.S. Pat. No. 6,002,260, issued Dec. 14, 1999, to Lau et al, discloses a fault sensor suitable for use in a heterogeneous power distribution system that executes a stored program and causes sufficient information to be collected to distinguish a source of fault current as being from a public utility portion of the power distribution network or from a distributed generator. Short circuit current and magnetizing current are distinguished based on differences in VI "signatures." In addition, the fault sensor periodically senses a condition of a battery of the fault sensor. When the condition of the battery indicates the battery power is low, the fault sensor sends a digital data signal including a low battery indication to a remote location. Subsequent to occurrence of a sustained power outage, the sensor detects that power has been restored and sends to a remote location a digital data signal including an indication that power has been restored. The sensor periodically measures peak line voltage and peak line current and reports peak values to the remote location.

U.S. Pat. No. 5,969,625, issued Oct. 19, 1999, to Russo, discloses the method and the apparatus for detecting a deteriorating condition in a bank of standby batteries includes injecting an audio frequency current into one of the battery buses or cables, detecting an audio frequency current signal, matched to the injected audio frequency current signal, that is carried by the battery bus and detecting a voltage drop, at the audio frequency, across the bank of standby batteries. In one embodiment, current transformers are utilized in connection with an oscillator (to inject the AF current signal) and detection circuits (comparators and operational amplifiers) are utilized to generate a representative current signal and a representative voltage signal. The device detects when the standby batteries are operating in a normal, stable condition, that is, when the bank is neither being recharged nor is discharging DC power to the load. During normal, stable operating conditions, a differential relationship is established between the representative voltage and representative current signals. In one embodiment, a microprocessor-based system monitors the float voltage of the battery in order to ascertain when the battery system is in a normal, stable operating condition. The microprocessor also initially establishes the differential between the representative voltage and the representative current signals. The method includes determining when the differential relationship between the voltage and current signals exceeds a predetermined value and issues an alarm signal at that time. The alarm signal may be deferred until the differential relationship exceeds the predetermined value for a predetermined period of time. In one embodiment, this analysis is conducted in the microprocessor-based system.

U.S. Pat. No. 5,923,148, issued Jul. 13, 1999, to Sideris et al, discloses an on-line battery monitoring system for monitoring a plurality of battery cells identifies and computes individual cell and battery bank operating parameters. The system comprises a controller for designating a given battery cell to be monitored, a multiplexer responsive to designation by the controller for selecting a given battery cell to be monitored or for selecting a battery pack to be monitored, an analog board for receiving electrical signals from a given battery cell for providing an output representing measurement of a parameter (voltage, temperature, and the like) of the given battery cell, a voltage sensor circuit for sensing voltage appearing across positive and negative terminals of the battery pack, and a control board responsive to address information for selectively initiating a load test, battery bank charging, or common-mode voltage measurement.

U.S. Pat. No. 5,839,093, issued Nov. 17, 1998, to Novosel et al, discloses both fault location and fault resistance of a fault that are calculated by the present method and system. The method and system takes into account the effects of fault resistance and load flow, thereby calculating fault resistance by taking into consideration the current flowing through the distribution network as well as the effect of fault impedance. A direct method calculates fault location and fault resistance directly while an iterative fashion method utilizes simpler calculations in an iterative fashion which first assumes that the phase angle of the current distribution factor is zero, calculates an estimate of fault location utilizing this assumption, and then iteratively calculates a new value of the phase angle of the current distribution factor and fault location until a fault location is ascertained. Fault resistance is then calculated based upon the calculated fault location. The techniques are equally applicable to a three-phase system once fault type is identified.

U.S. Pat. No. 5,659,237, issued Aug. 19, 1997, to Divan et al, discloses a technique for charge equalization of a series connected string of battery cells. The secondary windings of a transformer having a single primary winding and multiple secondary windings are connected across each battery cell to be equalized. A single power converter applies a charging signal to the primary of the transformer, inducing a charging current in each secondary which is inversely related to the charge on the battery cells to be equalized. The transformer is preferably implemented as a coaxial winding transformer having low secondary-to-secondary winding coupling. The power converter is preferably implemented as a forward converter supplied with DC power from an adjustable DC power source. A source voltage provided by the DC source may preferably be adjusted during the course of charge equalization to preferentially direct charge to weaker cells. The charge equalization system may be used in combination with a bulk charging system to provide for both rapid charging of a battery string as well as equalization of the battery cells within the string.

U.S. Pat. No. 5,656,931, issued Aug. 12, 1997, to Lau et al, discloses a fault current sensor device that detects and distinguishes abnormal current events on alternating current overhead and underground power transmission lines. The sensor distinguishes whether the momentary or sustained fault is a line-to-ground fault, line-to-line fault or a three-phase fault. The sensor determines whether the overload has occurred on all three phases, or only on one or two phases, of the power line in an unbalanced situation. The device can be remotely reprogrammed to alter its trigger or threshold level and can be remotely reset after a fault has occurred.

U.S. Pat. No. 5,390,064, issued Feb. 14, 1995, to Russo, discloses a current limiting method and apparatus for preventing fault overload in a utility power transmission system employs a high power, superconducting coil based pulse transformer for saturating the core of the utility power transformer thereby limiting its current carrying capacity. The utility transformer core is biased to a disadvantageous portion of its B-H curve. A fault condition is detected and as a result, the superconducting coil is quenched thereby sending a high energy pulse of current into the utility transformer magnetic core. The core, while heating, does not exceed its capability to maintain a stable thermal condition while at the same time limiting the current being transformed from its input to output lines, until a transformer circuit breaker activates.

U.S. Pat. No. 5,254,930, issued Oct. 19, 1993, to Daly, discloses a battery charger for charging a plurality of batteries that includes a voltage supply connected by a pair of switches to a power converter including a transformer having a primary winding and a plurality of secondary windings. Each secondary winding is coupled to a battery. Voltage is transferred from the voltage supply to the primary winding when the switches are closed and current is transferred from the secondary windings to the batteries when the switches are open. Charge control circuitry monitors the voltage of each battery and the total battery voltage and determines the amount of current to supply to the batteries. Supervisory logic monitors the current received from the secondary windings by each of the batteries and the voltage of each of the batteries to determine the charge status of each battery and the operating status of the power converter. If one battery continues drawing a greater proportion of the maximum current relative to the remaining batteries after the predetermined voltage limit has been reached, this indicates that there is a short circuited cell causing one battery to draw a greater proportion of current or that there is a cell with high impedance causing one battery to draw a smaller proportion of current. For both fault conditions, the supervisory circuit detects the current imbalance and generates a shutdown signal. The shutdown signal is also asserted when the supervisory circuit detects an over voltage condition in any of the batteries, or an over current in the primary winding. The shutdown signal subsequently precludes further operation of the charge control circuit for a predetermined time period, alerting the system operator of a problem within the battery backup system.

U.S. Pat. No. 4,956,739, issued Sep. 11, 1990, to Becker et al, discloses a device to locate internal faults in a high-voltage capacitor battery that has a plurality of symmetrically parallel and series-coupled capacitor banks arranged in parallel branches coupled by shunt branches. The phase angles of the shunt currents flowing in the shunt branches relative to the total current flowing in the parallel branches are determined. A fault is located in one of the capacitor banks based upon these determined phase angles.

U.S. Pat. No. 4,697,134, issued Sep. 29, 1987, to Burkum et al, discloses a testing device that measures the impedance of secondary cells that form a battery, such as a lead acid battery, while the battery is in a float charge condition and connected to an active electrical load. The impedance measurement is made at a frequency selected to be different from those frequencies otherwise present in the charger-load circuit. A first application of the testing device monitors the battery for a change in impedance that can signal a developing defect in one or more individual cells or intercell connections that can prevent the battery from delivering its stored energy to the load. In a second application, the testing device is used to compare the impedance of individual cells and electrical connections to locate faulty components.

U.S. Pat. No. 4,217,645, issued Aug. 12, 1980, to Barry et al, discloses a system for automatically monitoring a plurality of parameters of a plurality of cells in a lead-acid storage battery system. A transponder means responsive to a frequency pattern corresponding to a digital command is located at each cell to be monitored and includes a plurality of sensors which provide analog signals having an amplitude related to the value of the parameters being monitored. In a remote scanner/display means, a microprocessor generates a digital interrogation command (containing a transponder address, sensor selection, and reply duration commands) which is converted to a frequency pattern and coupled to the transponder. In response to the command, the transponder couples the analog signal from the selected sensor to a voltage-controlled oscillator and the output of the oscillator is coupled for the selected reply duration to the scanner/display means where the frequency of the signal is determined under the control of the processor. The information is stored and averaged within the microprocessor and may be displayed upon operator request and an alarm provided if any parameter of any cell exceeds specified limits.

U.S. Pat. No. 7,148,654, issued Dec. 12, 2006, to Burany et al, discloses a system and method for monitoring cell voltages for a plurality of electrochemical cells connected in series forming a cell stack. The method includes dividing the cells into at least two cell groups, measuring the voltage across each cell group and estimating the minimum cell voltage for each group based on the average cell stack voltage and an estimated number of deficient cells in each group. The lowest minimum cell voltage for the entire cell stack is then determined.

U.S. Pat. No. 7,081,737, issued Jul. 25, 2006, to Liu et al, discloses a monitoring circuit for monitoring a voltage level from each of a plurality of battery cells of a battery pack includes an analog to digital converter (ADC) and a processor. The ADC is configured to accept an analog voltage signal from each of the plurality of battery cells and convert each analog voltage signal to a digital signal representative of an accurate voltage level of each battery cell. The processor receives such signals and provides a safety alert signal based on at least one of the signals. The ADC resolution may be adjustable. A balancing circuit provides a balancing signal if at least two of the digital signals indicate a voltage difference between two cells is greater than a battery cell balance threshold. An electronic device including such monitoring and balancing circuits is also provided.

U.S. Pat. No. 6,983,212, issued Jan. 3, 2006, to Burns, discloses a battery management system for control of individual cells in a battery string. The battery management system includes a charger, a voltmeter, a selection circuit and a microprocessor. Under control of the microprocessor, the selection circuit connects each cell of the battery string to the charger and voltmeter. Information relating to battery performance is recorded and analyzed. The analysis depends upon the conditions under which the battery is operating. By monitoring the battery performance under different conditions, problems with individual cells can be determined and corrected.

U.S. Pat. No. 6,844,703, issued Jan. 18, 2005, to Canter, discloses a battery cell balancing system for a battery having a plurality of cells. The system includes a power supply and a plurality of transformer/rectifier circuits electrically coupled to the cells. Preferential charging occurs for a cell with the lowest state of charge. At least one current limiting device is electrically coupled to the transformer/rectifier circuits and the power supply. The current limiting device buffers a source voltage from a reflected voltage of at least one of the plurality of cells).

U.S. Pat. No. 6,803,678, issued Oct. 12, 2004, to Gottlieb et al, discloses a UPS system for providing backup power to a load includes: a power input; multiple batteries; multiple battery housings, each containing one of the batteries, the batteries being coupled in parallel; multiple battery-monitor processors, each monitor being disposed in a respective one of the battery housings and coupled to the corresponding battery; a UPS processor coupled, and configured, to receive monitor data from the plurality of battery-monitor processors; a UPS-processor housing containing the UPS processor and being displaced from the battery housings; and a power output coupled and configured to selectively provide power from one of the power input and the batteries.

U.S. Pat. No. 6,664,762 issued Dec. 16, 2003, to Kutkut, discloses a battery charger for charging high voltage battery strings that includes a DC-to-AC converter, which drives the primary of a transformer having multiple secondaries. Each secondary winding has a corresponding output stage formed of a rectification circuit, output inductor, and output capacitor. The output terminals of the output stages are connectable either in parallel or series. In either configuration, inductor current and capacitor voltage automatically balance among the output stage circuits. A controller normally regulates output terminal voltage by operating in voltage mode, but limits current by operating in a current mode when the average of inductor currents exceeds a specified limit. Reconfiguration from parallel to series, or vice versa, is obtained physical reconnection of the output stage terminals and adjustment of a single voltage feedback scaling factor. Connecting the output stages in series to produce a high voltage output reduces voltage stresses on the rectification circuits and enables use of Schottky diodes to avoid reverse recovery problems.

U.S. Pat. No. 6,583,603, issued Jun. 24, 2003, to Baldwin, discloses an apparatus and method for controllably charging and discharging individual battery cells or groups of battery cells in a string of batteries employed as a back-up power supply. The apparatus includes battery supply modules for at least partially isolating battery strings from the load bus and primary power supply. The partial isolation is effected by a switching network including two controlled switches arranged in parallel to selectively isolate the string of batteries. In certain disclosed embodiments, one of the controlled switches is turned on to connect the string of batteries to the load bus until the other controlled switch closes. The system includes a main power supply that supplies a power bus to a regulator in each battery supply module, which is used for charging the battery string, and a discharge bus to each battery supply module for discharging the batteries.

U.S. Pat. No. 6,268,711 issued Jul. 31, 2001, to Bearfield, discloses a battery manager that provides the ability to switch multiple batteries, battery cells, or other forms of power sources to power external devices individually, in series, and/or in parallel. The device is typically electronic based and consists of voltage level detecting circuits for comparing each power source to a reference voltage, field-effect transistor (FET) control logic for controlling the switching matrix, and a switching matrix which accomplishes the required configuration of power sources to provide an output power source. The invention can be extended with the addition of an output power monitor, DC/DC converter, and control signals that augment internal switching. Depending upon implementation requirements, the battery manager can be in the form of a single integrated circuit.

U.S. Pat. No. 6,181,103 issued Jan. 30, 2001, to Chen, discloses a system converting a smart battery pack into a removable and data accessible (RADA) battery pack and an intelligent power management algorithm embedded in the host computer. The RADA battery pack contains a temperature sensor, a display unit, and a memory (EEPROM). Peripherals mounted on the host computer side contain a control unit, a charging circuit, a load circuit, a voltage divider, a current detector, a temperature control circuit, and a data bus are used to cope with the removal and data access operation for the AICPM system. The removable and data-accessible battery pack utilizes the functions provided by this invention to read, update, and record data about the battery pack, such as number of times used, remaining capacity, usable time, and nominal capacity. It also stores these data in the EEPROM of the RADA battery pack so that when the battery pack is used next time, the AICPM system can read out these data from the EEPROM and use them as the battery pack new information.

U.S. Pat. No. 6,031,354 issued Feb. 29, 2000, to Wiley et al, discloses an on-line battery management and monitoring system and method for monitoring a plurality of battery cells identifies and computes individual cell and battery bank operating parameters. The system comprises a central monitoring station to which a plurality of controllers is connected, each controller having a plurality of battery cells which it monitors. Features of the invention include the following: display of measurement and alarm condition data for each of the battery cells connected to each of the controllers; color-coded display of data for a battery cell, the display color being dependent upon the condition of the battery; performance of data analysis and initiation of necessary maintenance requests; operation of the controllers in an automatic local mode, automatic remote mode, or maintenance mode; provision for periodic calls from the controllers to the central monitoring station; and generation of red alarm calls, yellow alarm calls, downscale alarm calls, and diagnostic calls between the central monitoring station and the controllers.

U.S. Pat. No. 5,982,143, issued Nov. 9, 1999, to Stuart, discloses an electronic battery equalization circuit that equalizes the voltages of a plurality of series connected batteries in a battery pack. The current waveform is in the shape of a ramp for providing zero current switching. The transformer has a primary winding circuit and at least one secondary winding circuit. In one embodiment, each secondary winding circuit is connected to a different pair of batteries. The equalizing current is provided to the lowest voltage batteries in one-half of the battery pack during one-half of the charging cycle. The equalizing current is then provided to the lowest voltage batteries in the other half of the battery pack during the other half of the charging cycle. In another embodiment, each secondary winding circuit is connected to a different single battery. The equalizing current is supplied to a lowest voltage battery in the battery pack during each half of the switching cycle. The electronic battery equalization circuit also includes a feedback control circuit coupled to the primary winding circuit for controlling the current from the equalizing current supply source. In another embodiment, optically coupled switches are connected to a battery voltage monitor to provide equalizing current to the lowest voltage even and odd numbered battery in the battery pack.

U.S. Pat. No. 5,923,148 issued Jul. 13, 1999, to Sideris et al, discloses an on-line battery monitoring system for monitoring a plurality of battery cells identifies and computes individual cell and battery bank operating parameters. The system comprises a controller for designating a given battery cell to be monitored, a multiplexer responsive to designation by the controller for selecting a given battery cell to be monitored or for selecting a battery pack to be monitored, an analog board for receiving electrical signals from a given battery cell for providing an output representing measurement of a parameter (voltage, temperature, and the like) of the given battery cell, a voltage sensor circuit for sensing voltage appearing across positive and negative terminals of the battery pack, and a control board responsive to address information for selectively initiating a load test, battery bank charging, or common-mode voltage measurement.

U.S. Pat. No. 5,914,606 issued Jun. 22, 1999 to Becker-Irvin, discloses a circuit and method for making differential voltage measurements when one or both measurement points are at voltages that exceed those allowed by a typical differential amplifier, and is particular useful for monitoring the individual cell voltages of a number of series-connected cells that make up a rechargeable battery in which some cell voltages must be measured in the presence of a high common mode voltage. Each measurement point is connected to an input of a respective voltage divider, with all the divider outputs connected to a multiplexer having two outputs. The two multiplexer outputs are connected to a differential amplifier. When the voltage dividers are "closely matched," the output of the differential amplifier is directly proportional to the differential voltage between the pair of points to which the dividers are connected, and the differential voltage between those two points is accurately determined. The voltage dividers divide down the voltage of each measurement point so that each is low enough to be input to a conventional differential amplifier. By selecting the "ratio" of each voltage divider, the circuit can be used to measure differential voltages in the presence of almost any common mode voltage. The invention requires a single differential amplifier powered by a conventional dual power supply.

U.S. Pat. No. 5,666,040, issued Sep. 9, 1997 to Bourbeau, discloses a safe, low-cost battery monitor and control system, Electronic modules are connected to the terminals of respective batteries that make up a series string. Each module produces a go/no-go signal for each of four battery conditions: over-voltage, under-voltage, over-temperature and float-voltage, which are read by a network controller connected to each module via a single three-wire local area network. Based on the information received, the controller can adjust the charging current to the string, terminate the charge cycle, limit the current drawn from the string when in use, or disconnect the string from the system it is powering. The controller can record a history of the charge and discharge activity of each battery, so that the weakest batteries can be identified and replaced instead of scrapping the entire string. The system controls the charging current delivered to each battery during a charge cycle to insure that each battery is neither overcharged nor undercharged, by connecting a bypass circuit across the battery's terminals to reduce the charging current when an over-voltage condition is detected, or by reducing charge current to the string. A battery's voltage measurement is temperature compensated so that it can be accurately compared to temperature dependant limits. The addressable switch is bidirectional, so that the controller can, for example, force bypass resistors to be connected across selected batteries in order to heat up the batteries in a cold environment.

US Patent Publication 2007/0279003, published on Dec. 6, 2007, to Altemose et al, discloses a system for balancing charge between a plurality of storage battery cells within a storage battery. The battery balancing system sense changes, possibly caused by environmental influences, in the overall resonant frequency of charge balancing circuits contained within the battery balancing system. Using a phase locked loop based controller, the battery balancing system compensates for the change in resonant frequency by driving the battery balancing circuits at a frequency that matches the actual sensed resonant frequency of the battery balancing circuits.

An article by Kong Zhi-Guo et al, is entitled "Comparison and Evaluation of Charge Equalization Technique for Series Connected Batteries", *Power Electronics Specialists Conference,* 2006. PESC '06. 37$^{th}$ IEEE 18-22 Jun. 2006, pp. 1-6.

An article by Jim Williams and Mark Thoren is entitled "Novel measurements circuit eases battery-stack-cell design", EON, Jan. 10, 2008, p. 47.

An article by N.H. Kutkut et al, is entitled "Charge equalization for series connected battery strings", *Industry Applications*, IEEE Transactions on Volume 31, Issue 3, May-June 1995 pp. 562-568.

The above approaches do not solve the aforementioned problems. According to the inventors, it would be desirable to provide a cell monitoring system with minimal complexity, which also provides features that eliminate the need for fusing on sense lines, provides electrical isolation for each cell, limits leakage current drains on the cells, and limits the overcharge rates for the individual battery cells. It would be desirable to keep the number of connections to a minimum. In battery assemblies, it is often desirable to monitor the cell voltages of the individual cells, strings of cells, and/or the entire battery to improve the battery operation and lifetime. Those of skill in the art will appreciate the present invention that addresses the above and other problems.

SUMMARY OF THE INVENTION

An object of the present invention is to provide an improved battery system which can be operable for sensing the health of individual cells and/or groups of battery cells.

Another possible object of the present invention is to provide lightweight circuitry with minimal connections for a battery system for sensing the health of individual cells and/or groups of battery cells.

Yet another possible object of the present invention is to provide a safer battery system with inherent galvanic isolation, which is operable for sensing problems and/or the lack of problems in individual cells and/or banks of battery cells.

Yet another possible object of the present invention is to provide an improved battery system for sensing problems in individual cells and/or groups of battery cells while providing the ability to spot a single bad cell and/or a problem in a group of cells in a battery that may comprise several hundred or more battery cells.

These and other objects, features, and advantages of the present invention will become apparent from the drawings, the descriptions given herein, and the appended claims. However, it will be understood that the above-listed objectives and/or advantages of the invention are intended only as an aid in quickly understanding aspects of the invention, are not intended to limit the invention in any way, and therefore do not form a comprehensive or restrictive list of objectives, and/or features, and/or advantages.

Accordingly, the present invention provides an apparatus to monitor a plurality of battery cells operably connected to each other. In one possible embodiment the apparatus is comprised of the following elements: a plurality of transformers wherein the battery cells are operably connected to a corresponding plurality of battery windings; a plurality of first windings operably related to the plurality of transformers; at least one waveform generator utilized to produce a waveform, wherein the at least one waveform generator is operably connected to the plurality of first windings thereby allowing the plurality of first windings to receive the waveform; and at least one signal detector operably connected with the plurality of transformers to detect a signal produced by the plurality of transformers responsively to the waveform and to thereby monitor the plurality of battery cells.

The apparatus may further comprise a plurality of second windings for the transformers wherein the signal detector is operably connected to the plurality of second windings. The second windings may comprise a predetermined different numbers of turns for predetermined transformers. Stated otherwise, the second windings may comprise unique number of turns or a set of unique number of turns for unique transformers or a unique set of transformers, respectively.

The signal detector can be made operable for detecting peak voltages of the induced signal to thereby distinguish between the cells to locate any underperforming battery cells. As one possible example, each of the second windings may comprise a unique number of turns relative to other of the plurality of second windings.

The first windings for the plurality of transformers can each be connected in series with each other. Likewise the second windings may be connected in series with each other.

The apparatus may comprise a plurality of saturable transformer cores for the plurality of transformers. The waveform is then operable to drive the plurality of saturable transformer cores from being magnetically saturated in one direction to being magnetically saturated in an opposite direction.

The apparatus may further comprise interconnections between the battery cells which electrically connect at least a portion of the battery cells in parallel with each other and/or may further comprise interconnections between the battery cells which electrically connect at least a portion of the battery cells in series with each other.

In one embodiment, the apparatus may require only four connections or less to electrically connect each transformer to the waveform generator and the detector. In another embodiment, the apparatus may require only two connections or less to electrically connect to each transformer to the waveform generator and the detector.

In another embodiment, a method is provided for monitoring a plurality of battery cells. Possible steps of the method may comprise electrically connecting transformers to the battery cells, electrically connecting the waveform generator to the transformers to produce a waveform, and detecting an induced signal in the plurality of transformers responsively to the waveform and indicative of any underperforming battery cell within the plurality of battery cells.

The method may further comprise utilizing a plurality of battery windings of the transformers to connect with the battery cells. The step of electrically connecting the waveform generator to the transformers may further comprise electrically connecting the waveform generator to first windings of the plurality of transformers. The method may further comprise providing second windings for the plurality of transformers and connecting a detector to the second windings.

The method may further comprise varying a number of turns of the plurality of second windings for the plurality of transformers to locate any underperforming battery cells. The method may further comprise utilizing the waveform to drive a plurality of saturable cores of the plurality of transformers from being magnetically saturated in one direction to being magnetically saturated in an opposite direction.

In another embodiment, an apparatus to monitor a plurality of battery cells may comprise transformers operably connected to battery cells, and/or a waveform generator operable to produce a waveform, and/or first windings for the plurality of transformers operably connected to the waveform generator.

At least one signal detector may be connected with the transformers for detecting any underperforming battery cells.

A signal detector is operably connected to the second windings. The second windings may comprise different numbers of turns for different of the transformers. In one embodiment, transformer cores for the transformers may comprise a mass equal to or less than 10 grams.

BRIEF DESCRIPTION OF THE DRAWINGS

FIG. 2 is a block diagram for battery system in accord with one possible embodiment of the present invention;

FIG. 10 is an electronic schematic diagram which utilizes additional transformers that provide precision voltages references that might be utilized for auto calibrations to improve cell voltage measurement accuracy in accord with yet another possible embodiment of the invention;

FIG. 11 is a physical layout, which shows multiple transformer cores, diode, and related wiring in accord with yet another possible embodiment of the invention;

FIG. 29 is a graph which utilizes the polarity of two voltages to provide the ability to determine which of eight strings of battery cells in FIG. 28 has a fault in accord with one possible embodiment of the present invention.

DETAILED DESCRIPTION OF PREFERRED EMBODIMENTS

Figure 1:
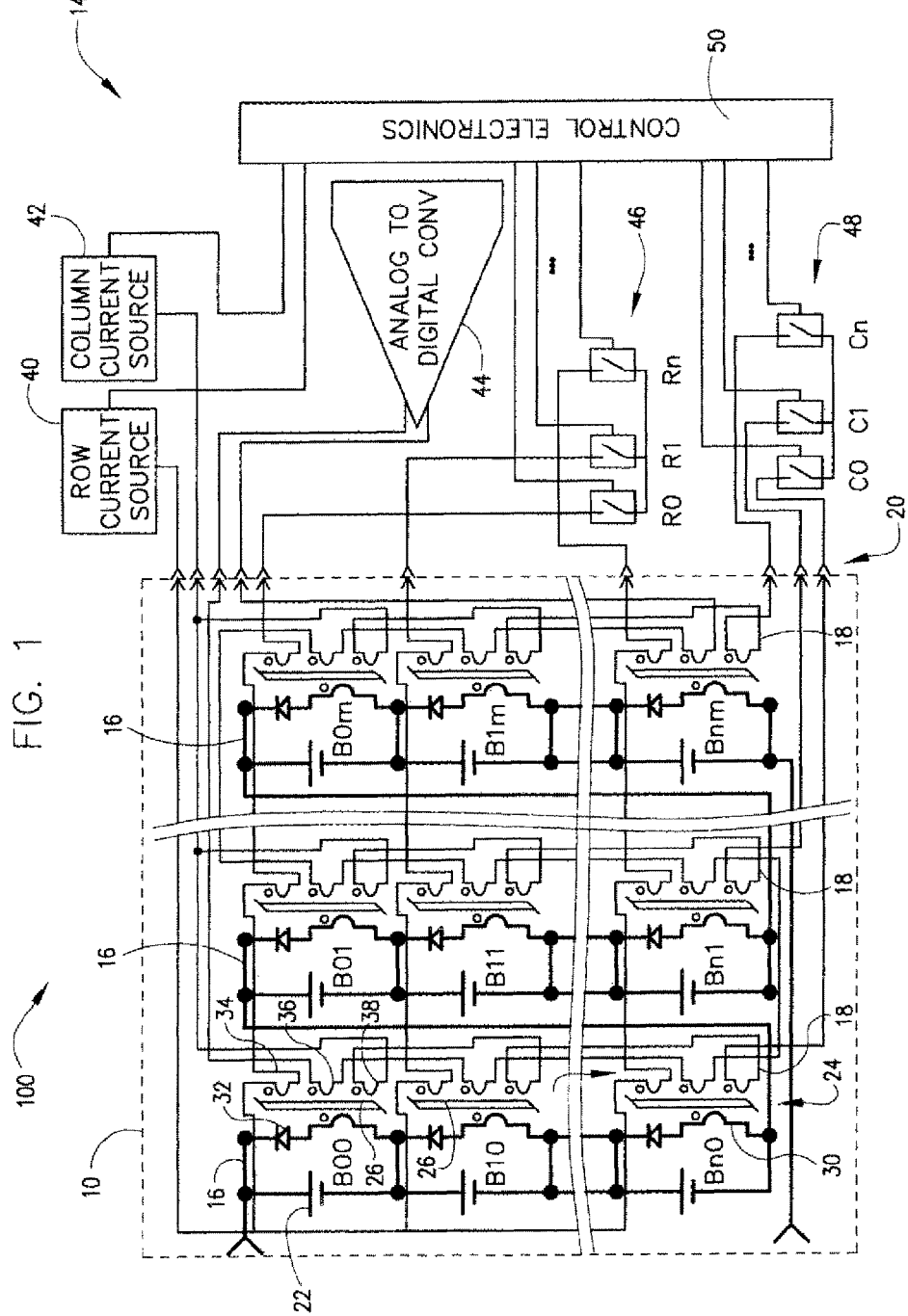
FIG. 1 is an electronic schematic diagram of a battery cell array layout in accord with one possible embodiment of the present invention.

The present invention may be used to monitor individual battery cell voltages and/or groups of battery cells. Battery cell voltages may be monitored to detect cells that are not producing as much current and/or which have excessive voltage drop due to poor cell health.

In one possible non-limiting embodiment of the invention, a monitoring network is provided that can be added to a battery consisting of many parallel and/or series connected battery cells. The network may be configured to allow the health of individual cells and/or groups of cells, as measured by the current that they produce under load, to be monitored. If one or more cells are producing less current than the others, the network allows the discrepant cells and/or groups to be sensed. In one embodiment, the cells that are not performing correctly may also be located.

As one example, a sense network of individual saturating transformers may be connected in series with individual cells of a bank of many parallel cells. In this example, the transformers share common excitation and sense windings. When a current waveform is applied to the excitation winding while a test load is placed on the whole battery, the waveform that appears on the sense winding allows poorly performing cells to be detected. Further, as is commonly known in the art, a transformer is a device that transfers electrical energy from one circuit to another through inductively coupled conductors, i.e., the transformer's coils or windings. Hence, a winding is an operational part of a transformer. For purposes herein, a transformer's winding may be described as "operably associated with" the transformer.

The use of transformers in the present invention for sensing and balancing circuitry results in intrinsic electrical isolation of the battery cells. Because sensing is made through the transformers, it is unnecessary to provide fusing on the sense wires. In one embodiment of the invention, possible examples of which are shown in FIG. 12-24, electronics such as diodes and/or FETs are not necessarily utilized and/or required. In another possible embodiment, the present invention may possibly utilize an array of saturating core transformers connected by diodes and/or FETs and/or other switching devices to battery cells.

Transformers are typically designed to operate without magnetic saturation. As well, the core of most transformers is not designed to retain any significant magnetization state. In most applications, it is usually essential to avoid reaching magnetic saturation since it is accompanied by a drop in inductance, which transformers typically require for proper operation. However, unlike typical transformers, the present invention uses magnetic saturation and magnetization of the core advantageously.

Magnetic saturation is a limitation occurring in inductors/transformers having a ferromagnetic or ferrimagnetic core. Initially, as current is increased, the magnetic flux increases proportionally. At some point, however, further increases in current lead to progressively smaller increases in magnetic flux. Eventually, the core can make no further contribution to flux growth and any increase thereafter is limited.

In other words, in typical transformer operation, current through the primary winding induces a change in magnetic flux in the transformer core. The change in magnetic flux then induces current flow in the secondary winding. However, if the transformer core is saturated, then a change in magnetic flux is not created by current flow through the primary winding. Thus, there will be little or no resulting current induced in the secondary winding. The transformer essentially ceases to operate when the transformer core is saturated.

The present invention utilizes transformers designed to saturate, as discussed in more detail in the paragraphs hereinafter. In one embodiment of the invention, multiple transformers may be excited simultaneously to detect cells which are not operating properly.

However, in another embodiment, only a selected transformer continues to operate. To make a measurement in a particular battery cell, the present invention applies a pulse to a selected transformer with a current direction that produces magnetic flux in a direction opposite to the direction of flux saturation. The selected transformer then saturates in the opposite direction. In other words, the selected transformer experiences a change in magnetic flux in response to current in the primary winding. Therefore, a sense winding will detect this change in flux, thereby detecting a voltage in the battery connected to the selected transformer. Only the selected transformer continues to operate due to magnetic flux change. Other non-selected transformers remain saturated in the same direction, and do not operate, and do not contribute any significant amount to the induced current in the sense coil of the selected transformer.

In the present invention, windings on the transformers may be used to allow an individual transformer to be selected by selectively saturating the core, whereupon the voltage/current of the associated battery cell may be measured. In another embodiment, charge can also be transferred to or removed from selected cells to balance the selected battery cells.

The transformers may or may not be electrically arranged in physical or virtual rows and columns with row and column windings. In one embodiment, the voltage amplitude of the pulses is limited by the diode and battery cell connected to the transformer, which may be measured with an analog to digital converter connected to a sense winding.

In one embodiment, the sense winding may be directed through the entire group of transformers, but saturation prevents all except the selected transformer from making a contribution to the reading. In another embodiment, the sense winding may be directed through an entire group of transformers, and change of direction of magnetization in the cores produces a signal that can locate faulty individual cells or groups of cells.

Addressable magnetic cores take advantage of a square hysteresis loop to retain, at least substantially, their magnetization state when no current is applied. A matrix of addressable magnetic cores was frequently used in magnetic core memories about fifty years ago. However, those magnetic core matrices were used simply to store information in the cores in the form of a flux state, which represented either a digital "1" or "0." Their use was unrelated to measuring analog values of a matrix of battery cell voltages and/or for balancing the cell voltages. In one possible embodiment, the present invention does not require addressing the row and column simultaneously, as was typically done previously in magnetic core memories. However, the present invention is not limited to any particular wiring arrangement for addressing and/or changing the magnetic flux states of the magnetic cores to measure and/or balance the battery cells.

Referring now to the drawings and, more particularly, to FIG. 1 and FIG. 2 there is shown one possible embodiment of battery system 100 in accord with the present invention. Battery system 100 may comprise battery assembly 10, which includes battery cell array 16. Battery cell array 16 may comprise parallel and/or series connected battery cells that store electrical energy. In FIG. 1, battery cell array 16 is darkened to allow the array to stand out more clearly.

Monitoring array 18 comprises transformer cores and interconnecting wires that allow the voltages of individual cells to be measured. Charge may be put in individual battery cells as desired. Monitoring array 18 may also comprise switch elements such as diodes, semiconductor switches, and the like. In this example, diodes such as diode 32 are shown connected to the winding of the transformers to which the battery cells are connected.

Battery voltage sensing system 14 connects to monitoring array 18 and comprises circuitry for measuring and/or balancing cell voltages. In this example, battery voltage sensing system 14 connects to monitoring array 18 via one or more connectors, designated as connector 20, and provides pulses for sensing and charging. In one embodiment, battery voltage sensing system 14 is separate from main charge system or power supply 12. In one possible embodiment, battery voltage and sensing system 14 may be designed to have the following functions:

1. Provide row and column pulses to select transformers and associated cells.
2. Measure the characteristics of the pulses on the sense winding to determine the voltage of the cells.
3. Supply balancing currents to selected cells by repeatedly pulsing the appropriate row and column windings.
4. Measure any reference voltages in the battery and perform self-calibration.
5. Report measured voltages to the user or an external computer system or network.
6. Decide which battery cells or cell banks need balancing currents.

In one embodiment, referring to FIG. 2, the present invention may be designed to be operable in parallel with what may be a simple battery charger that supplies the main charge current, such as main charge power supply 12. Main charge power supply 12 may be connected to battery assembly 10 with connector 21. The present invention can monitor cell voltage during and after charging. However, in one presently preferred embodiment, the balancing function is operated after the main charge currents are shut off.

Although the individual circuit elements are shown in detail hereinafter, the battery cells in FIG. 1 are labeled B00 to Bnm, with the m numbers being the rows, and the n numbers being the columns. The maximum array size is set by wire resistance and parasitic inductances in the collective sense windings that would cause waveform degradation. Utilizing only the circuitry of the embodiment shown in FIG. 1, an array of several hundred cells could be monitored. However, additional separate circuitry can be added to permit monitoring of any number of battery cells.

An example of a typical battery cell from FIG. 1 is battery cell B00, which may be labeled as battery cell 22, and is represented by a positive and negative electrode.

Figure 4:
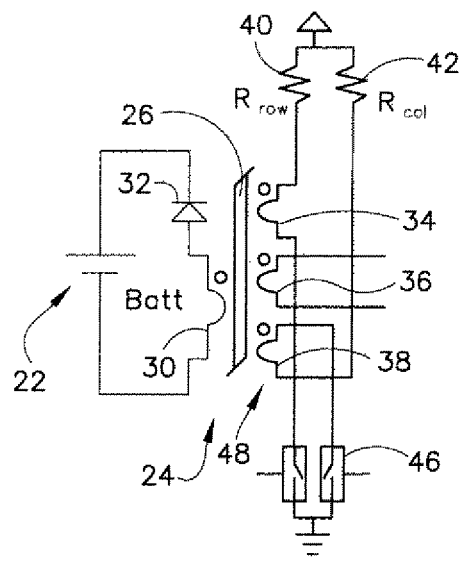
FIG. 4 is an electronic schematic diagram which shows a simplified circuit diagram associated with a single battery cell from an array of battery cells in accord with one possible embodiment of the present invention.

Referring to FIG. 4, there is shown a simplified drawing of battery cell 22. In FIG. 4, a typical transformer 24 is associated with battery cell 22, which comprises saturable core 26. A physical example of one possible suitable saturable core is illustrated in FIG. 11 as core 126. Transformer 24 has windings 30, 34, 36, and 38. Winding 30 may be referred herein as a secondary winding 30. Windings 34, 36, and 38 may be referred collectively herein as primary winding. In this embodiment, each individual battery cell is connected to an associated transformer. However, other embodiments may have other arrangements between battery cells and transformers, and some of the other possibilities are discussed hereinafter. Secondary winding 30 is connected to the battery cell associated with the transformer. In this embodiment, diode 32 may be utilized to allow charging current to flow into battery cell 22 but prevent leakage that would drain the battery. The primary winding comprises three separate windings, which include row select winding 34, column select winding 38, and a sense winding 36.

As can be seen in FIG. 1, the sense winding may pass through or be connected through all transformers. For example the sense windings may be series connected. It is then possible to measure all battery cell voltages of each battery cell or each bank of battery cells. As discussed hereinafter, the selection process permits measurement of individual battery cell voltages even if all transformer sense windings are connected in series.

The row select winding, such as row select winding 34, connects with all the transformers in a given row or virtual row of the transformer matrix.

The column select winding, such as column select winding 38, can be seen to connect with all the transformers in a given column or virtual column of the transformer matrix.

Figure 6:
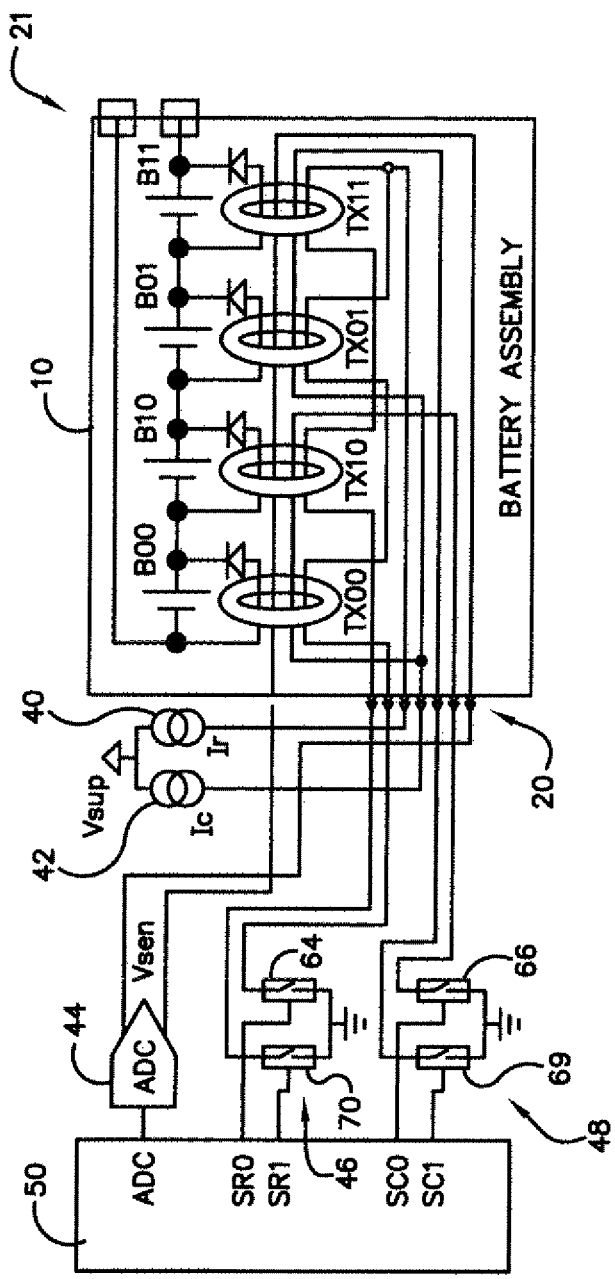
FIG. 6 is an electronic schematic diagram of a 2×2 battery cell array for use with FIG. 6 in accord with one possible embodiment of the invention.

While columns and rows are used herein to provide an easier and quicker understanding of the invention concepts, the actual physical layout may or may not correspond to this description. More generally, column and row descriptions may refer to a virtual column or row which may not be physically arranged as are the electrical connections. For example, FIG. 6 shows a circuit that could be physically arranged as a single 4×1 array as diagrammatically shown, but is electrically connected as a 2×2 array. The operation is described in terms of a 2×2 array with columns and rows. Thus, the use of column and row terminology is a convenient means visualizing the addressing techniques and understanding addressing of individual transformers. The column and row terminology of the invention is not limited to this wiring configuration and could have, for example, a 3-D structure with other windings, which may be configured to select individual transformers or transformer cores, as discussed hereinafter.

In other words, it will be understood that rows and columns as used herein may or may not correspond to physical rows and columns and may or may not correspond to the arrangement shown in the diagrams. Instead, rows and columns may be electrically configured in rows and columns. More generally, the rows and columns actually correspond and are intended herein to refer to groups of transformers and battery cells that may be more easily visualized in rows and columns. For example, "row" 0, and "column" 1 are labels that correspond, in matrix terminology, to a first group 01 and second group 02 which have an intersection at a particular transformer. Thus, rows and columns are simply easily understandable labels for various groups of transformers and battery cells. The terms row and column more easily provide a visual description of how a combination of a particular row winding and a particular column winding may be utilized to address a particular transformer, but in the present invention, row and column may also mean groups with intersection points.

Figure 9:
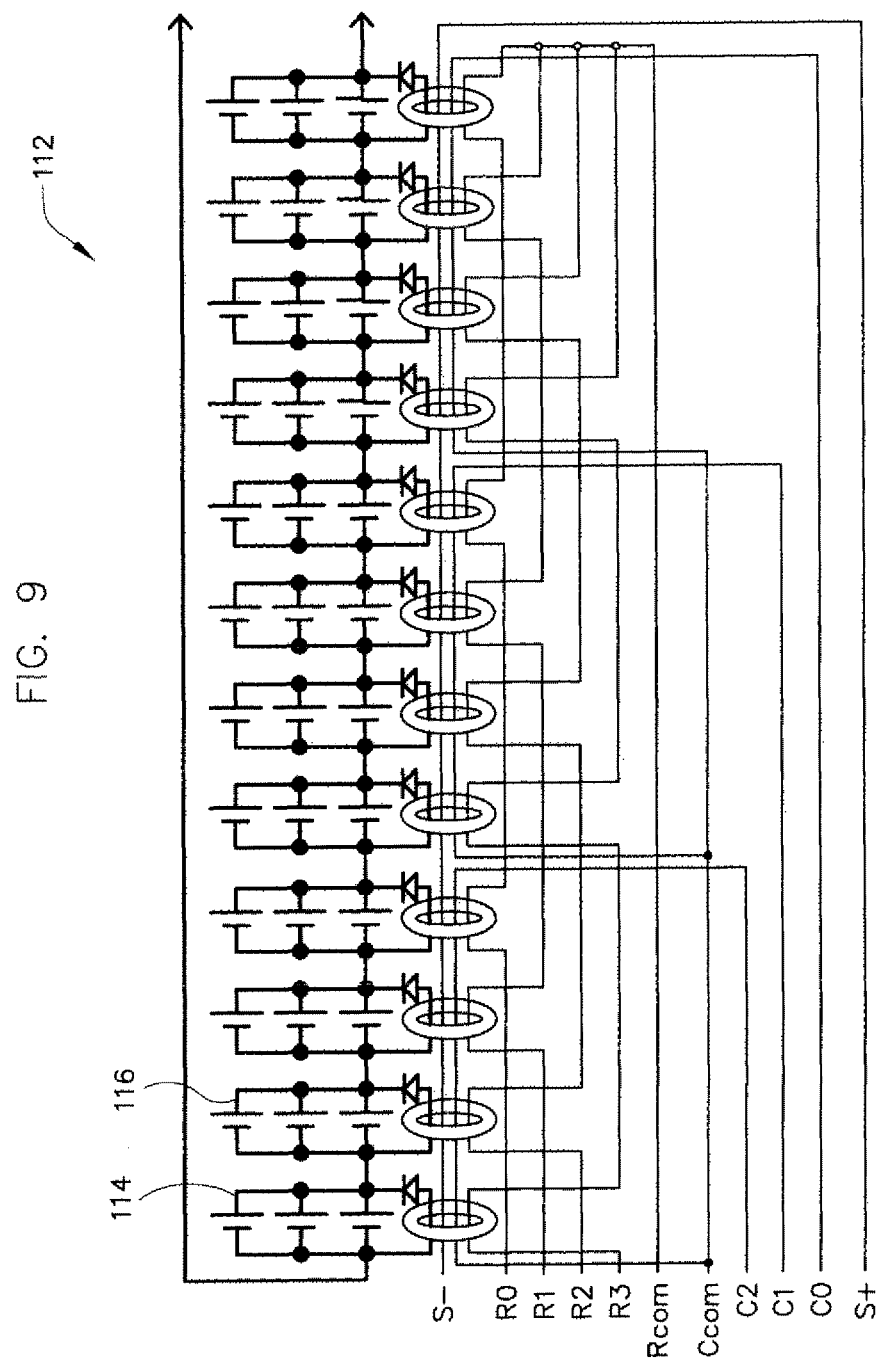
FIG. 9 is an electronic schematic diagram showing series connected banks of battery cells in accord with yet another possible embodiment of the invention.

In one embodiment of the invention, each battery cell (or bank of parallel battery cells as shown in FIG. 9) has a single transformer associated with it. As discussed above, the transformers may be electrically but perhaps not physically arranged in a matrix with rows and columns. This matrix does not need to correspond with the physical arrangement of the battery cells. For instance, there could be a single string of 24 cells with the corresponding transformers electrically arranged as a matrix of four rows and six columns. It is possible to have additional transformers in the matrix that are not associated with cells.

In the embodiment of FIG. 1, row and column current sources 40 and 42 may be utilized for saturating the transformer magnetic cores with a desired magnetic flux direction or magnetic state as discussed hereinafter. In one embodiment, a voltage supply and current limiting resistor may be utilized for current sources 40 and 42, which in combination effectively provide a current supply.

Pulses are produced utilizing current from row and column current sources 40 and 42 as row and column switches 46 and 48 are opened and closed, respectively. The pulses applied to the row and column windings should be sized to be able to swing one core from one magnetic extreme to the other. In one embodiment, the pulse generation circuitry is able to handle a momentary direct short once the cores are saturated. Therefore, a current source may be utilized although any suitably reliable power supply may be utilized so long as it operates as discussed herein. An inductive type current source may have difficulties with resetting. A transistor type current source will allow the inductance of the transformer to work itself out. If desired, the current source may be shared between rows or columns because in one possible embodiment only one row or column at a time is pulsed.

Analog to digital converter 44 may connect to the collective sense windings of the transformers to measure individual cell voltages as discussed hereinafter. Row switches 46 and column switches 48 are utilized to control the electrical current through the row and column current windings, and in this manner address particular transformers. Control electronics 50 are utilized to operate the aforementioned devices as discussed hereinafter. If desired, additional analog to digital converters could be connected to different groups of transformers to limit the collective length of the sense windings in any particular group.

Figure 3A:
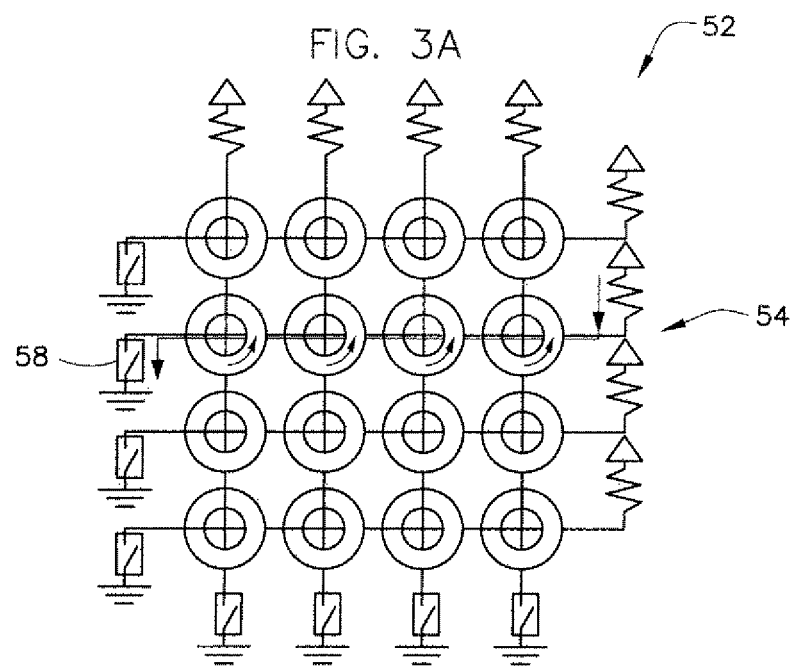
FIG. 3A is an electronic schematic diagram which illustrates a possible step of magnetizing cores CCW in a selected row N by closing a row switch in accord with one possible embodiment of the present invention.
Figure 3B:
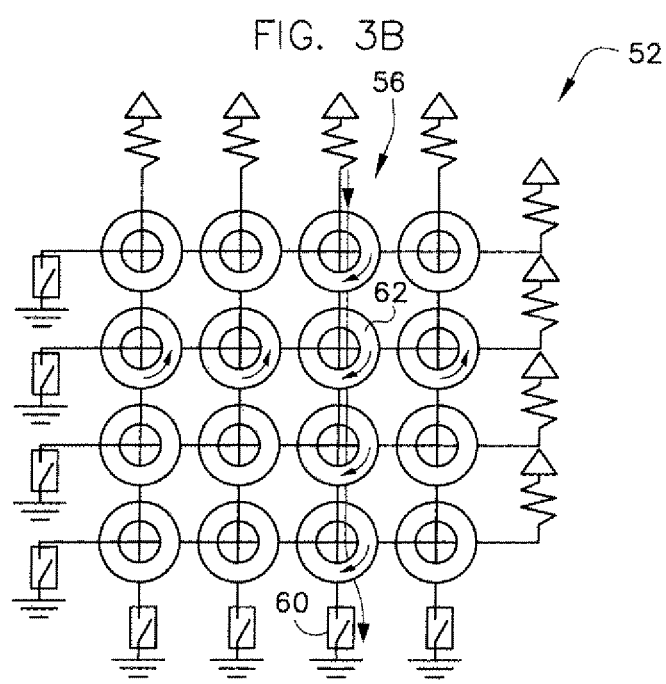
FIG. 3B is an electronic schematic diagram which illustrates a subsequent possible step from that shown in FIG. 3A, whereby in FIG. 3B cores in a selected column are magnetized CW by closing a column switch in accord, which results in a particular core in row N being the only core that is magnetized CW in accord with one possible embodiment of the present invention.

Array addressing operating principles of one possible embodiment of the present invention are illustrated in FIGS. 3A and 3B. A 4×4 array of transformers and transformer cores 52 is shown in FIGS. 3A and 3B. In the following steps, transformer core 62 is selected. Step 1: Row switch 58 is momentarily closed, whereby all cores in row 54 are magnetized to a first magnetic state such that the magnetic flux for each core flows in a first direction. As an example, the direction of the magnetic flux may be counterclockwise (COW) as indicated by the arrows. Row switch 58 may now be opened again. Step 2: Column switch 60 is momentarily closed whereby all cores in column 56 are magnetized in a second magnetic state such that the magnetic flux flows in an opposite direction. For example, the direction of the magnetic flux may be clockwise (CW) as indicated by the arrows. Now, desired core 62 has been selected because it is the only core in row 54 that is magnetized CW. As discussed in the following paragraphs, voltage measurements or power transfer for individual battery cells can be performed by using this addressing scheme.

Figure 7A:
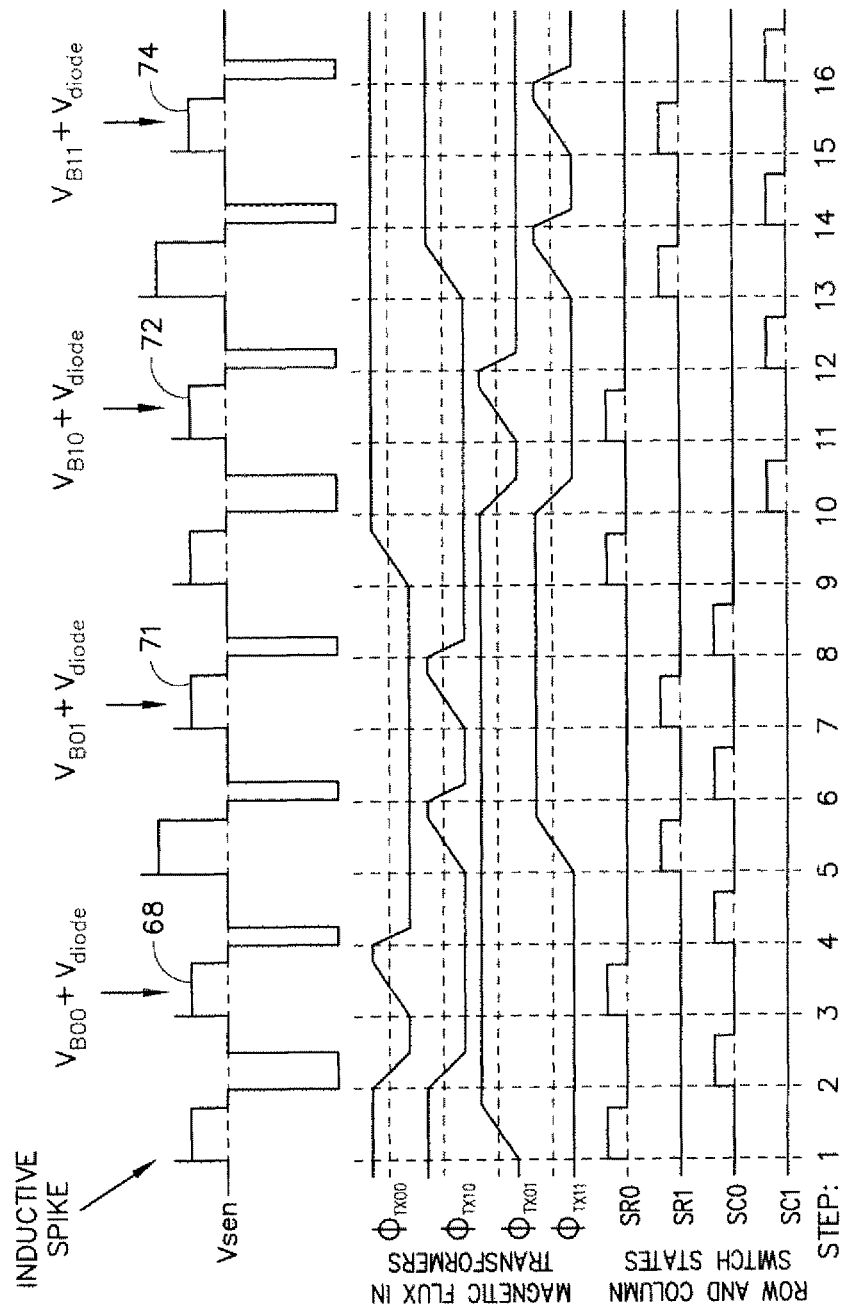
FIG. 7A is a pulse diagram example of selected measurement points in the 2×2 battery cell array of FIG. 6 during sixteen possible battery cell measurement steps that measure the individual voltages of the 2×2 battery cell array in accord with one possible embodiment of the invention.

FIG. 6 and FIG. 7A illustrate operation principles for cell measurement in accord with one possible embodiment of the invention. In this example, for ease of understanding, battery assembly 10 of FIG. 6 comprises a 2×2 array. The following method samples the cell voltage of each cell, as indicated at pulses 68, 71, 72, and 74, on the Vsen signal line shown in FIG. 7A. The signal flow chart of FIG. 7A is conveniently broken into sixteen steps as numbered at the bottom of the chart. ADC 44 measures voltages during pulses as shown by the Vsen signal line shown in FIG. 7A. The present invention may be utilized to perform the selection function by exploiting the nonlinear saturation and magnetization characteristics of transformers. In this embodiment, an individual transformer is addressed and the corresponding cell selected by alternately pulsing its row winding with positive pulses and its column winding with negative pulses.

As a general explanation of one embodiment of operation, when a row winding and column winding are alternately pulsed, all the transformers that share the sense winding fall into one of 4 classes.

A first group of transformers receives no pulses because neither their row nor column windings are pulsed. These transformers do not affect the amplitude of the pulse on the sense winding, which is measured by analog to digital converter (ADC) 44.

A second group of transformers receive only positive pulses on their row windings. After one or more pulses, these transformers will be saturated in a desired magnetic state. After several such pulses, they contribute negligibly to the sense winding pulse detected by ADC 44.

A third group of transformers receive only negative pulses on their row windings. After several such pulses, they are also saturated and will contribute negligibly to the sense winding pulse detected by ADC 44.

Finally, a selected transformer at the intersection of the selected row and column receives both positive row pulses and negative column pulses. This transformer alternates between positive and negative pulses. This transformer becomes the only transformer to produce a significant contribution to the sense winding. The positive pulses will forward bias the diode connected to the corresponding cell. This puts a small charge current into that cell, which when repeated may be utilized for balancing the associated battery cell. The voltage of the positive pulse is set by the diode forward voltage drop and the cell voltage.

A detailed description of measurement steps for all four cells of battery assembly 10 of FIG. 6 is as follows:

Measure Voltage of Cell B00 (Row 0, Column 0)
  1: Control electronics 50 is utilized to close row switch 64 to set all transformer fluxes in row 0 to a first flux state, which may be referred to as a positive flux state. Looking at the signal flow chart, SR0 (FIG. 7A) shows the positive pulse applied to row switch 64 by control electronics 50. When current from row current supply 40 flows through the row windings, this saturates the cores of TX00 and TX01 (row 0) to a positive magnetic flux state as shown in signal flow chart 7A. Row switch 64 is then opened as indicated by the pulse in SR0 of signal flow chart 7A. It will be noted that TX00 and TX01 are in row 0 based on their matrix identifier rather than being physically shown as being in a row 0. As discussed above, the terms "row" and "column" as used herein are not limited to physical rows and columns. Instead "row" and "column" are simply terms to describe groups of cores that have common intersections, which intersections are more easily visualized when discussing columns and rows.
  2: Reset all fluxes in column 0 to a negative magnetic flux state by closing column switch 66. In other words, control electronics 50 applies a momentary pulse that closes column switch 66, allowing current from column current source 42 to flow through the column windings that are connected as column 0. In particular, this saturates TX00 to a negative magnetic flux state. Note that Vsen goes to a negative value, namely, −Vsup. This pulse has a longer duration to reset multiple transformers. See also the equivalent circuit shown in FIG. 5B, which is discussed hereinafter.

3: Again, momentarily close row switch 64 to set fluxes in row 0 to a positive magnetic flux state. This will only result in flux change in TX00. The other transformers do not change their magnetic state and therefore do not induce current in the sense winding. Thus, at this time, Vsen $V_{B00}$ Vdiode. The voltage measurement may be taken after the initial spike on Vsen, such as in middle of pulse. Vsen is measured by ADC 44. See also the equivalent circuit shown in FIG. 5A, which is discussed hereafter. In other words, the voltage of a particular battery cell, namely battery cell B00 has now been measured in accord with one embodiment of the present invention. The process goes on to measure the voltage of all four battery cells.

Measure Voltage of Cell 810 (Row 1, Column

4: Reset fluxes in column 0 to a negative magnetic flux state, e.g. control electronics 50 momentarily activates relay (aka switch) 66.

5: Set the fluxes in row 1 to a positive magnetic flux state, e.g., activate relay, which may also be referred to as switch 70. The Vsen measured by ADC 44 will now be the sum of two battery voltages (plus diode drops) because two magnetic flux states change to a positive magnetic flux state, namely that of TX10 and TX11 as shown in FIG. 7A.

6: Reset column 0 fluxes to a negative magnetic flux state. This changes only TX10 to a negative magnetic flux state, as shown in FIG. 7A.

7: Set the fluxes in row 1 to a positive magnetic flux state, This will only result in flux change in TX10, and Vsen=$V_{B10}$+Vdiode. The voltage measurement may be taken after the initial spike on Vsen, such as in middle of pulse.

Measure Voltage of Cell B01 (Row 0, Column 1)

8: Reset column 0 fluxes, e.g., activate switch 66.

9: Set row 0 fluxes, e.g., activate switch 64.

10: Reset all column 1 fluxes negative, e.g., activate switch 69.

11: Set the fluxes in row 0 to a positive magnetic flux state, e.g., activate switch 64. The magnetic flux state of TX01 goes high, as shown in FIG. 7A. The voltage pulse will read Vsen=$V_{B01}$+Vdiode, when the voltage measurement is taken after the initial spike, such as in the middle of pulse.

Measure Voltage of Cell B11 (Row 1, Column 1)

12: Reset column 1 fluxes to a negative magnetic flux state, e.g., activate switch 69. As shown in FIG. 7A, the magnetic flux state of TX01 saturates negative. The magnetic flux state TX11 is already negative.

13: Set row 1 fluxes, e.g., activate switch 70. Since two cores change, Vsen is the sum of two battery voltages (plus diode drops). The magnetic flux state of TX11 goes positive, 14: Reset column 1 fluxes to a negative flux state. The magnet flux state of TX11 goes negative.

15: Set the fluxes in row 1, e.g., activate switch 70. Then, Vsen=$V_{B11}$+Vdiode. The voltage measurement may be taken in middle of pulse.

16: Reset column 1 fluxes.

Figure 7B:
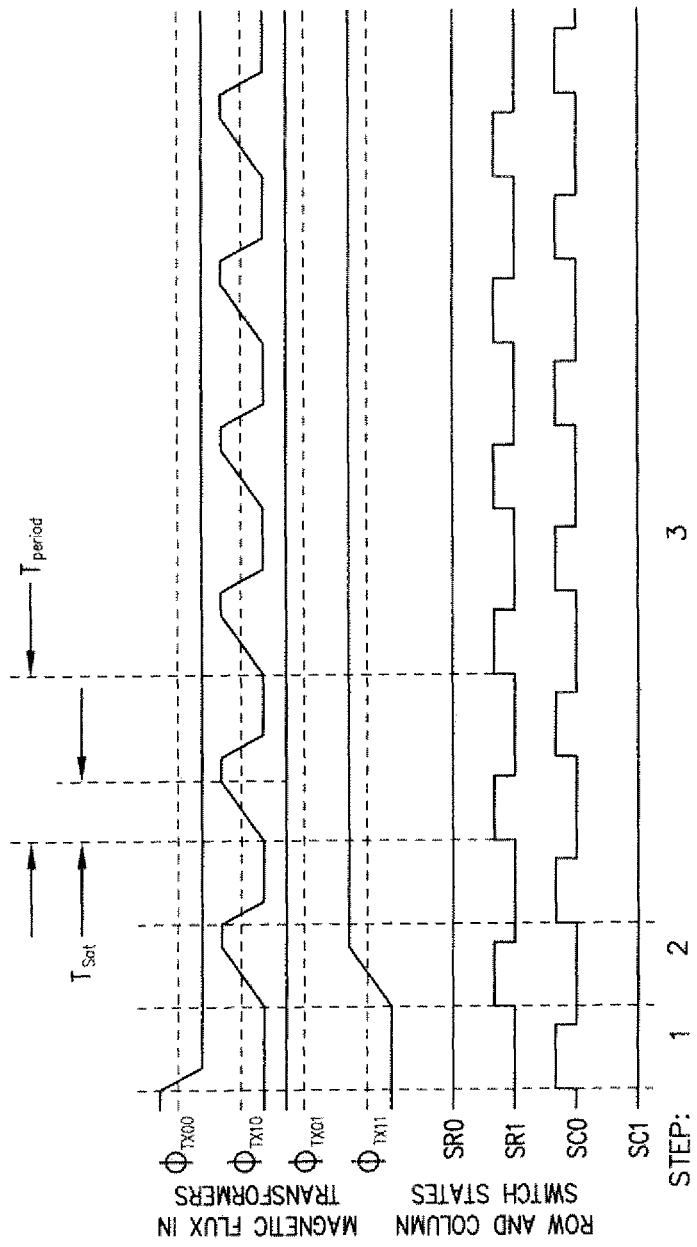
FIG. 7B is a pulse diagram example of selected measurement points in the 2×2 battery cell array of FIG. 7A during possible steps to balance battery cell B10 of the 2×2 battery cell array in accord with one possible embodiment of the invention.

FIG. 7B is a signal diagram that illustrates the signals involved in cell balancing. In this example, cell B10 of FIG. 7A is balanced, i.e., charge is added to cell B10. As seen above, any cell could be selected to balance.

Steps involved in balancing cell B10 (row 1, column 0):

1: Set column 0 fluxes to a negative magnetic flux, e.g., switch 66 as shown in step 1 of FIG. 7B via control circuitry (aka electronics) 50. Then the magnetic flux state of TX00 and TX10 are both saturated negative.

2: Set all transformer fluxes in row 1 to a positive magnetic flux, e.g. pulse switch 70. Both TX10 and TX11 are now saturated to a positive magnetic flux state.

3: Reset all fluxes in column 0 negative. Only TX10 goes to a negative magnetic flux as shown in FIG. 7B. Then, alternate applying pulses between switch 70 for row 1 (SR1) and switch 66 for column 0 (SCO). The flux state of TX10 alternates between saturating positive and negative. This process acts as a simple switching power supply and charges B10 with the following current:

$$I_{charge}=I_R*(T_{Sat}/T_{Period})$$

where $T_{Sat}$ (the time for saturation) and $T_{Period}$ (the period of the recharging cycle) are shown in FIG. 7B In this way, if a cell is measured as being below the voltage of other cells, the cell can be balanced or charged up. The cell voltage can be simultaneously monitored as shown in step 7 of the cell voltage measurement as shown in FIG. 7A. In the disclosed embodiment, charge current may range up to a few hundred milliamps. The charge current can be increased with additional transformer winding turns. It should be noted that a "transformer winding" as used herein might go through the transformer core without looping around the core.

While only charging is illustrated, if the diodes are replaced with switches, such as FETs, so that current could flow in either direction through the batteries, then the same techniques discussed hereinbefore may be utilized to select particular cells for either adding charge to or subtracting charge from individual battery cells. Accordingly, the present invention is not limited to only charging batteries for balancing.

The battery connector(s) pin count is kept quite efficient in accord with the present invention. For example, if the battery has N cells, and N Is less than or equal to the number of rows (R) times the number of columns (C), then the total number of connector pins would be R+C+4. There would need to be one for each row, with one common to all rows, one for each column, one common to all columns, and two for the sense winding, for a total of R+C+4.

For numbers of cells less than about 10, the direct sense line connection may be optimum. However, for batteries with more than about 30 cells, the number of contacts for direct sense lines (the standard battery practice) in the prior art is more than double that necessary for the present invention.

Figure 5A:
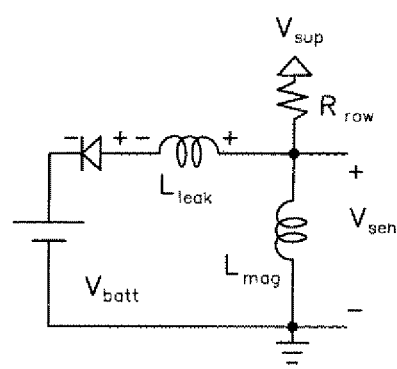
FIG. 5A is an electronic schematic diagram which shows an equivalent circuit for a saturable transformer after closing row switch in accord with one possible embodiment of the invention.

In more detail of operation of both cell measurement and balancing, and referring to FIG. 5A and the Vsen line in FIG. 7A, there is shown an equivalent circuit after initial closing of the row switch where the magnetic flux is initially negative for the circuit but then eventually saturates with a positive magnetic flux. The sense line Vsen therefore detects a positive pulse. The leakage inductance causes an initial spike on Vsen, as shown on the leading edge of positive pulses in FIG. 7A. The time constant that sets the time for leakage inductance to charge up can be adjusted by selection of $V_{sup}$ and $R_{Row}$, which form the current supply, During this step, charge is also supplied to the battery as discussed hereinbefore. In one preferred embodiment, the time for leakage inductance to charge up is less than half of the time for the core to saturate to permit good measurements. However, this time may be considerably faster. In this embodiment, after the leakage inductance spike has died down, then $$V_{sen}=V_{batterycell}+V_d$$

where $V_d$ is the voltage drop across the diode, and $V_{battery\ cell}$ is the battery cell voltage.

Figure 5B:
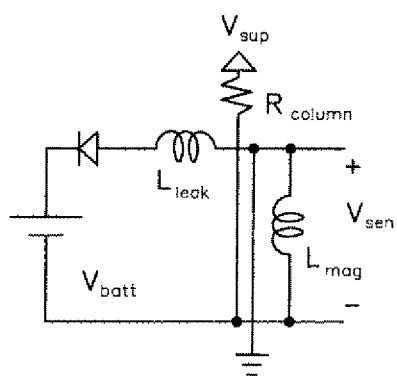
FIG. 5B is an electronic schematic diagram which shows an equivalent circuit for a saturable transformer column after closing column switch in accord with one possible embodiment of the invention.

FIG. 5B shows the equivalent circuit after closing the column switch, whereupon the magnetic flux eventually changes from positive to negative. The diode in this case is reverse biased because the column winding is oppositely wound than the row winding. See for example row select winding 34 and column select winding 38 in FIG. 1. After the column switch is closed, Vsen goes to −Vsup until the core saturates. This can be seen as the negative pulses on the Vsen trace in FIG. 7A. When more transformers change magnetic flux states, the negative pulse is wider.

Figure 8:
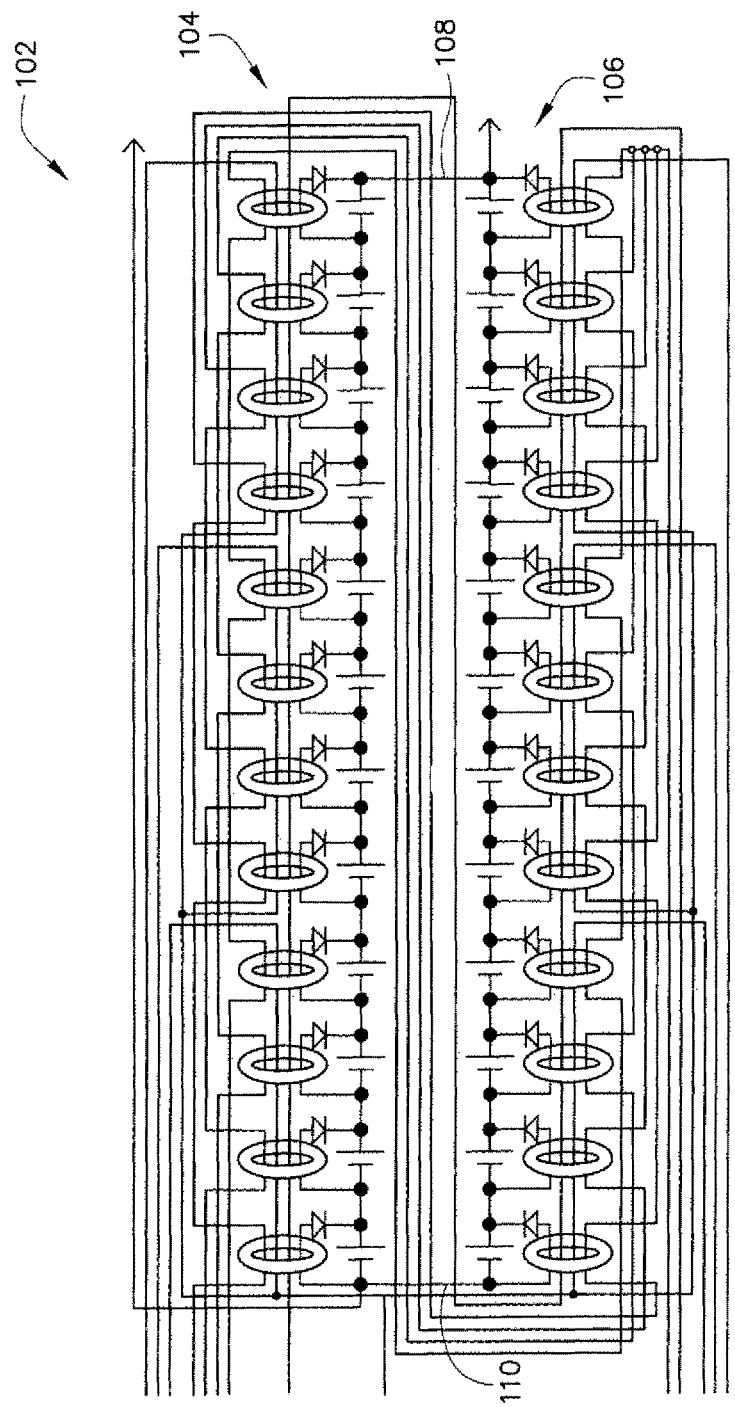
FIG. 8 is an electronic schematic diagram showing two parallel strings of series connected battery cells in accord with yet another possible embodiment of the invention.

Referring now to FIG. 8, there is shown series parallel circuit 102, which discloses one of many possible variations of the present invention. In this example, series connected strings of battery cells 104 and 106 are connected in parallel as indicated by parallel connections 108 and 110. It will be appreciated that each individual battery cell is associated with a transformer as discussed hereinbefore. Therefore, each battery cell voltage may be individually measured and the cell balanced as discussed hereinbefore.

Referring to FIG. 9, there is shown another of many possible variations, namely series bank circuit 112. In this example, subsequent parallel-connected banks of battery cells are also connected in series. In FIG. 9, representative battery cell banks 114 and 116 each have three cells connected in parallel, although other numbers of cells may be connected in the banks. With each bank is associated a transformer whereby the voltage of each bank may be measured and balanced.

Another possible embodiment of the present invention is shown in FIG. 10 where circuit 118 may utilize additional transformers besides those used to measure and balance cells, e.g., transformers TX02 and TX12. In this example, TX02 and TX12 are connected to precision voltage references 120 and 122. Voltage reference 120 may be set to a maximum normal cell voltage. Voltage reference 122 may be set to a minimum normal cell voltage. In this way, measurements by analog to digital converter 44 (see FIG. 1) may be accurately calibrated automatically, perhaps with each cycle of measuring battery cell voltages.

Although many types of precision voltage references are available, one type of suitable voltage regulator may comprise a TL431 or similar type connected to the transformer utilizing the same type of diode such as diode 32 shown in FIG. 4. In this example, the transformer and the diode, which may be the same as those used for measuring the battery cells, are connected to a shunt voltage reference and capacitor. The capacitor is charged up by the diode, and its voltage is limited by the shunt. The control electronics 50 (see FIG. 1) may then be programmed to perform an auto calibration at any desired intervals to reduce cell voltage measurement inaccuracies. In sum, measurement accuracy may be improved by including one or more of these voltage reference channels that include matching circuitry as that utilized for measuring the battery cell voltages.

FIG. 11 shows a physical layout of one possible configuration 124 of diode 128 and cores 126. In this embodiment, several small cores 126 are connected in series, which improves the mechanical form factor.

Thus, in one possible embodiment of the invention, an array of saturating transformers are connected by diodes to a plurality of battery cells. Each transformer may have a row winding, a column winding, and a sense winding. A particular transformer may then be addressed by alternately applying positive pulses to its row winding and negative pulses to its column winding. Other transformers that share these windings will saturate with a desired magnetic flux direction as they receive pulses of only one polarity. The voltage of the corresponding battery cell can be measured by an analog-to-digital converter connected to the sense-winding common to all the transformers as energy is transferred to that cell through the diode. Operation of battery cell selection requires transformers that once magnetized (saturated) in one direction, hold their magnetization so that the magnetic field in the core changes only a small amount if the magnetization pulse is repeated. Transformer cores with a "square loop" are designed to have this property.

In the above example, when the selected transformer receives a train of positive and negative pulses, the amplitude of the negative pulses is set by the pulse generation circuitry. The amplitude of the positive pulses is limited by the battery voltage and the forward conduction voltage of the diode associated with the cell. There will be an initial transient caused by the leakage inductance associated with the diode and cell connection. The capacitance of the cell and the cell resistance also affect the pulse shape.

Measuring the cell voltage transfers a small amount of charge to the cell. If this is done repeatedly, a quantity of charge will be transferred to the battery. The average current is limited by the positive current pulse amplitude, which is limited by requirements of voltage monitoring. In one embodiment, this level of charge current is thereby automatically limited. Balancing charge may be provided after the main charge is provided by a main charger.

Many variations or additions of the embodiments of the invention discussed hereinbefore are possible. For instance, a current sensor may be utilized to sense the magnetic saturation and thereby more accurately eliminate or reduce unnecessary pulses and control the required pulse length. While Vsen presently measures the pulse height, it is also possible to obtain measurements of battery cell charger by measuring other aspects of the voltage pulse such as slope, length, and the like of the voltage pulse. Compensation may be provided for diode voltage drops such as MOSFET devices or other devices to eliminate the diode drop on the cell side. Thus, additional circuitry can be provided on the cell side of the transformers. Multiple turns on the saturating transformers can be used to extend pulses, change voltages, and/or allow higher charge currents. Soft turn-on of row and column switches can be used to compensate for stray inductance. Adjustable row and column switch current sources can be used to optimize measurement and balancing. Parallel/series arrangements of diodes or other elements can be utilized to improve failure tolerance. Transistors, MOSFET devices, and the like may be utilized in place of diodes.

Figure 12:
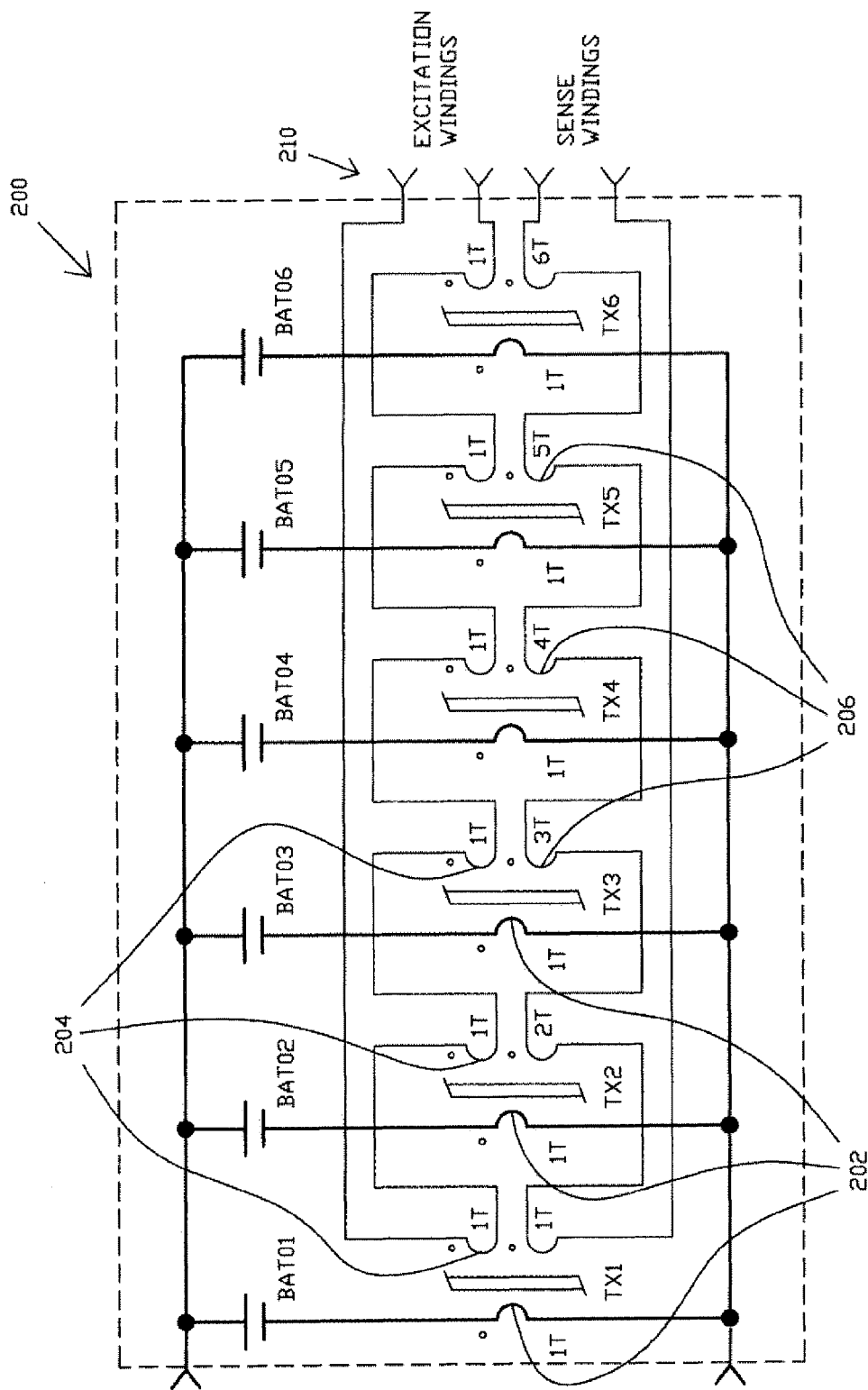
FIG. 12 is a circuit diagram showing a battery with a plurality of battery cells and monitoring network which allows the health of individual battery cells to be monitored in accord with one possible embodiment of the present invention.

In another embodiment, it is not necessary to address individual or groups of transformers or provide semi-conductor switching devices. Accordingly, FIG. 12 shows battery fault detection system 200. The battery assembly in battery fault detection system 200 has only six battery cells BAT01-BAT06. However, as discussed hereinbefore, the detection systems disclosed herein may be utilized with large numbers of battery cells. In this example, each battery cell has an associated transformer TX1-TX6.

Although not required in all embodiments, in this embodiment each transformer has three windings. Battery windings, as indicated at 202, may comprise a single turn in series with the monitored cell and in this particular embodiment are directly connected to a battery. In this embodiment, each excitation winding 204 comprises a single turn. In this embodiment, the excitation windings 204 are in series with each other for all of the transformers.

In this embodiment, each transformer also has a sense winding 206 comprising one or more turns. Sense winding 206 can be provided in series with the sense windings of the other transformers. In this embodiment, the number of turns will be different for each transformer so that each transformer has a different number of turns as compared to the remaining transformers. In this example, the number of turns for each transformer is indicated on FIG. 12 and ranges sequentially from one turn or pass through the transformer core to six turns or passes through the transformer core. Other numbers of turns might be utilized if desired.

Figure 13:
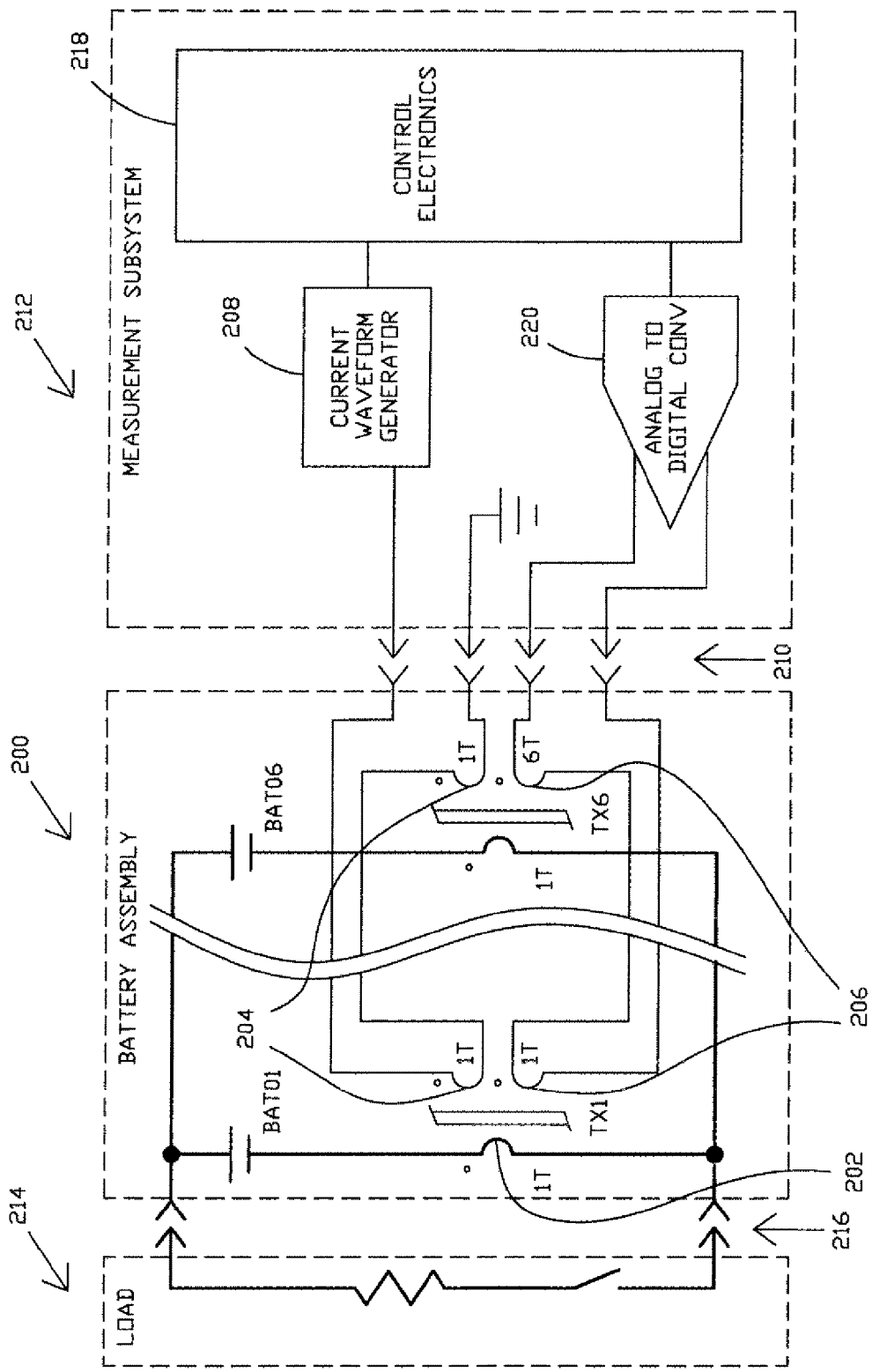
FIG. 13 is a circuit diagram showing a load, battery assembly, and measurement subsystem which allows the health of individual battery cells to be monitored in accord with one possible embodiment of the present invention.

As shown in FIG. 13, excitation windings 204 are supplied with a current waveform from current waveform generator 208. For example, current waveform generator 208 may produce a current waveform with a positive going zero crossing portion, such as a bipolar triangular wave, or a sine wave. The waveform must be of sufficient amplitude or power to swing the transformer cores from being magnetically saturated in one direction, to being unsaturated, and then to being magnetically saturated in the other direction. A voltage pulse will appear at sense windings 206 of each transformer when the core of the transformer is momentarily unsaturated.

In operation, when the total current of the transformer excitation windings 204 passes through zero, the transformers will momentarily become unsaturated, and at that time will induce a voltage pulse on each of sense windings 206. Since excitation windings 204 pass through all the transformers with the same number of turns, they will each have the same excitation current waveform. As well, if each battery cell current through battery windings 202 is the same, then all the transformers will pulse at the same time. A healthy battery will show a single large pulse on the sense winding. This pulse will be composed of simultaneous pulses from each transformer added together.

However, if any battery cell current through the associated battery winding 202 is different, making the total current through winding 204 different, then the transformer for that cell will pulse at a different time than the others. A battery with a poorly performing cell (one that is providing significantly less current than the other cells) will show two pulses, one corresponding to the poorly performing cell, and the other corresponding to the good cells. In this embodiment, the deviant cell will be identifiable by the amplitude of the pulse due to the different number of turns in the associated sense winding 206. If a particular cell produces less current, then the amplitude of the pulse for the associated transformer will correspond to the number of turns on the sense winding.

In one preferred embodiment, the invention is intended to be operated during test and verification operations of the battery, and not during normal load operations. However, the invention may be operated during load checks of the battery or during operating phases when the current consumption is well characterized.

Battery fault detection system 200 may be implemented with numerous alternate embodiments. As examples, all the sense windings and excitation windings may have one turn. In this case, a bad cell is sensed but the particular cell is not identified. In another possible embodiment, a separate sense winding is not used and instead a back EMF is sensed on the excitation winding, making the construction even simpler. In another embodiment, if there are many parallel strings of battery cells that make up a battery, then battery fault detection system 200 might be utilized to locate a faulty string of battery cells. Many other possible configurations are possible when using transformers for detection of underperforming battery cells, some of which are discussed herein.

Placing series transformers TX1-TX6 on each battery cell BAT01-BAT06 will affect the battery impedance. However, this effect can be significantly reduced by selecting "square loop" transformers or saturable core transformers, as discussed hereinbefore. These transformer cores are constructed of a material that, once magnetized, holds its magnetization. This means that once load current is first applied to the battery, the transformers will all become magnetized (saturated) in the same direction. The transformers will stay in this saturated, low inductance state until current reverses (charge current). Suitable transformer cores for this purpose have been discussed hereinbefore. Generally, the weight of the transformer cores operable to provide the above described functions can be less than 10 grams and may be less than 5 grams. Larger transformer cores could also be utilized, especially where weight is not a significant concern.

As discussed previously, the transformers provide electrical isolation for battery monitoring system 200 to reduce the danger of shocks. The embodiment of the invention shown in FIG. 12 adds a small four-pin connector to the battery. If it is not desired to use the transformers for charging/balancing the battery cells, then switching elements such as diodes, transistors, and FETs need not be connected to the transformers as have been used in some embodiments discussed hereinbefore.

FIG. 13 shows battery monitoring system 200 for a battery assembly in conjunction with measurement subsystem 212 and load 214. Load 214 may be connected to the battery assembly via connector 216.

Measurement subsystem 212 may be mounted outside the battery assembly and is then connected thereto via four pin connector 210. Measurement subsystem 212 provides excitation current to excitation windings 204 utilizing current waveform generator 208, which may be controlled with control electronics 218. Current waveform generator 208 may provide a current waveform with a controlled ramp rate across zero current. Current waveform generator 208 may be implemented in different ways. For example a square wave may be produced for driving an inductor to thereby produce a triangular current waveform. As another possibility, a sine wave current waveform, or the like, could be utilized.

Analog to digital converter 220 may be connected to sense windings 206 as a signal detector for measuring the amplitude and timing of the pulses that appear on the sense winding. Control electronics 218 may then be utilized to analyze and/or report measured voltages to an operator or an external computer system or network.

With use of very long instrumentation cables, measurement errors in detecting pulses on the sense connections may result. However, controlled impedance cables combined with impedance matching networks may be utilized to compensate for this measurement error. The present invention does not interfere with the use of an external battery charger.

Figure 14:
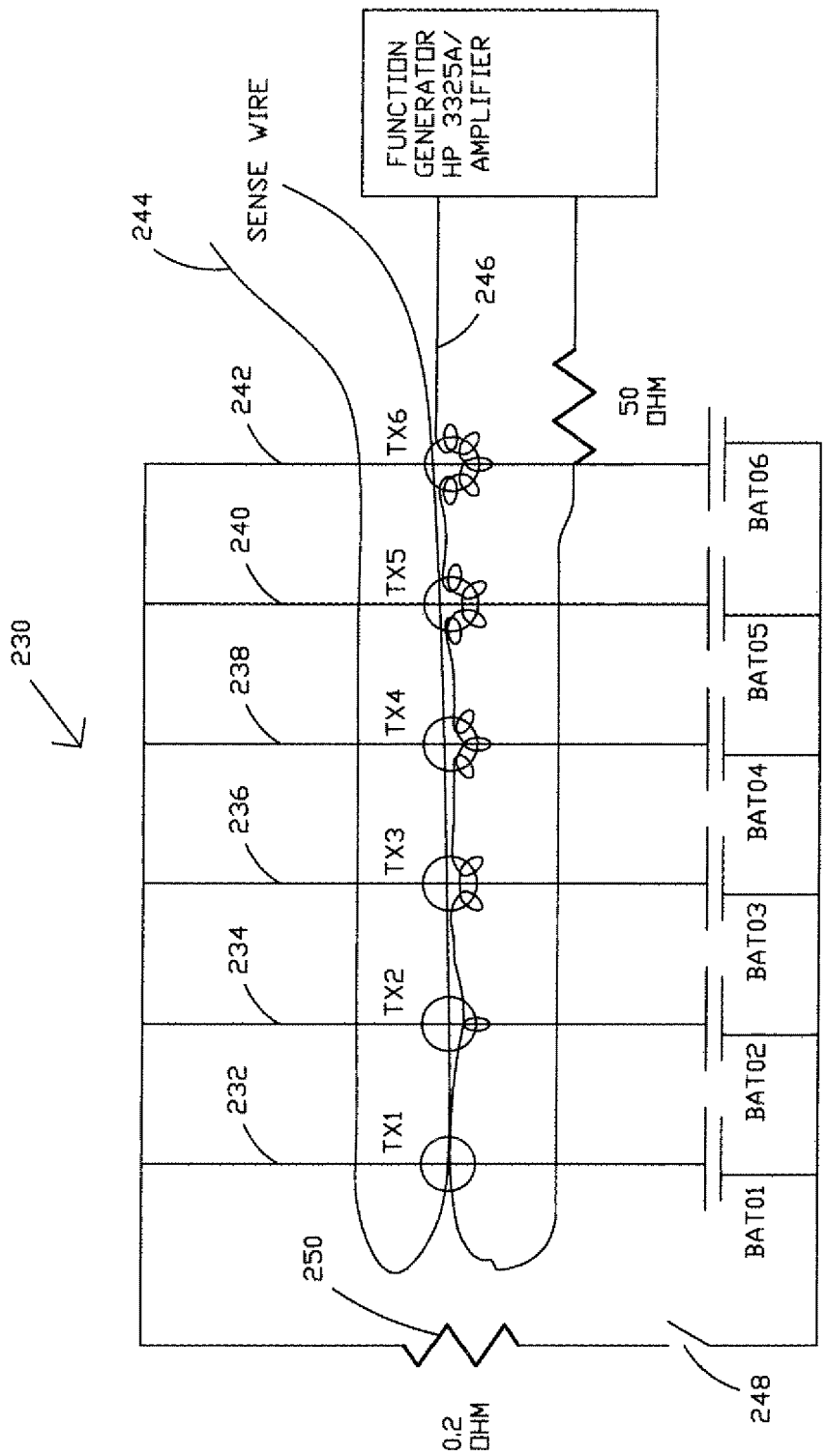
FIG. 14 is a circuit diagram for a prototype monitoring system with magnetic cores wound with different numbers of excitation windings which allows the health of individual battery cells to be monitored in accord with one possible embodiment of the present invention.

FIG. 14 shows prototype battery monitoring system 230, which is utilized to produce signals as shown in oscilloscope views of FIG. 15 through FIG. 24. The signals are detected by analog to digital converter 220 and may be utilized to diagnose the health of the battery assembly. In this example, battery cells BAT01 through BAT06 of the battery assembly are connected in parallel. Saturable toroid magnetic cores, which may be round doughnut-like cores such as those shown in FIGS. 3A and 36 for example, can be utilized in transformers TX1-TX6. Wires 232, 234, 236, 238, 240, and 242 pass through and/or wrap around the cores of TX1-TX6 and also connect to corresponding battery cells BAT01 through BAT06. These windings of TX1-TX6 may therefore be referred to herein as the battery windings.

In this embodiment, sense wire 244 passes through each core and the two ends are connected to the oscilloscope (not shown), and may be referred to herein as the sense windings. Excitation wire 246 pass through each core and loop around each core with a sequentially increasing number of loops, and may be referred to herein as excitation windings. Excitation wire 246 effectively has one loop or pass through the core of TX1, two loops or passes through the core of TX2, and so forth. The ends of excitation wire 246 are connected to a current source created with a function generator and the 50 ohm resistor.

It will be noted that whereas in battery monitoring system 200 the excitation wire had only one loop and the sense wire had a variable number of loops, in this example sense winding 244 has only one loop or pass through the transformer cores and excitation wire 246 has a variable number of loops or passes through the transformer cores. Thus, this embodiment is not limited to either of these constructions. For that matter, the sense windings, the excitation windings, the battery windings, and/or combinations of these can conceivably comprise a variable number of loops through the transformer cores.

A 0.2 ohm resistor provides a known value for load 250 for testing the battery assembly. Load switch 248 may be opened or closed to disengage or engage load 250. To show the signals, an oscilloscope is utilized to provide visual measurements of peak voltage levels, which measurements can be used to detect faulty cells. However, other peak voltage detection circuitry, integrated circuits, and/or the like may be utilized to distinguish peak voltages.

Figure 15:
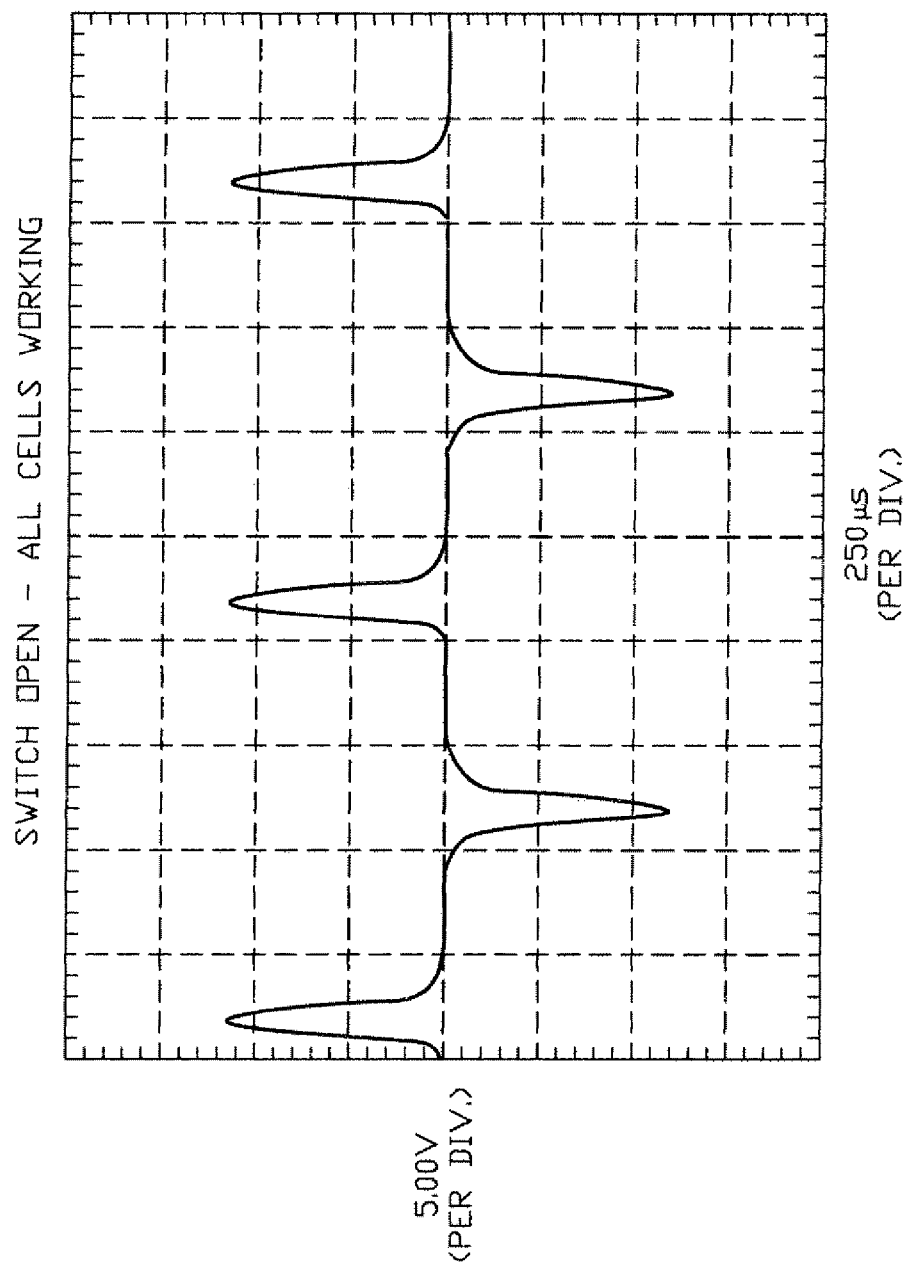
FIG. 15 is an oscilloscope measurement of the sense winding of the prototype monitoring system of FIG. 14 with all cells working and the load switch open in accord with one possible embodiment of the present invention.

High power batteries may be constructed by connecting large numbers of individual battery cells in parallel. The purpose of this project was to develop a method to easily detect any faults in individual cells without the introduction of complex circuitry. Sense wire 244 detects the magnetic field variations in the transformers. When a cell has current going though it, the corresponding transformer hysteresis curve is adjusted eliminating the effect of the sine wave. FIG. 15 shows an example of all cells working with switch 248 open.

FIGS. 16-24 show the corresponding peak voltages with load switch 248 closed for various situations of battery assembly health. The load of resistor 250 in this case is known.

Figure 16:
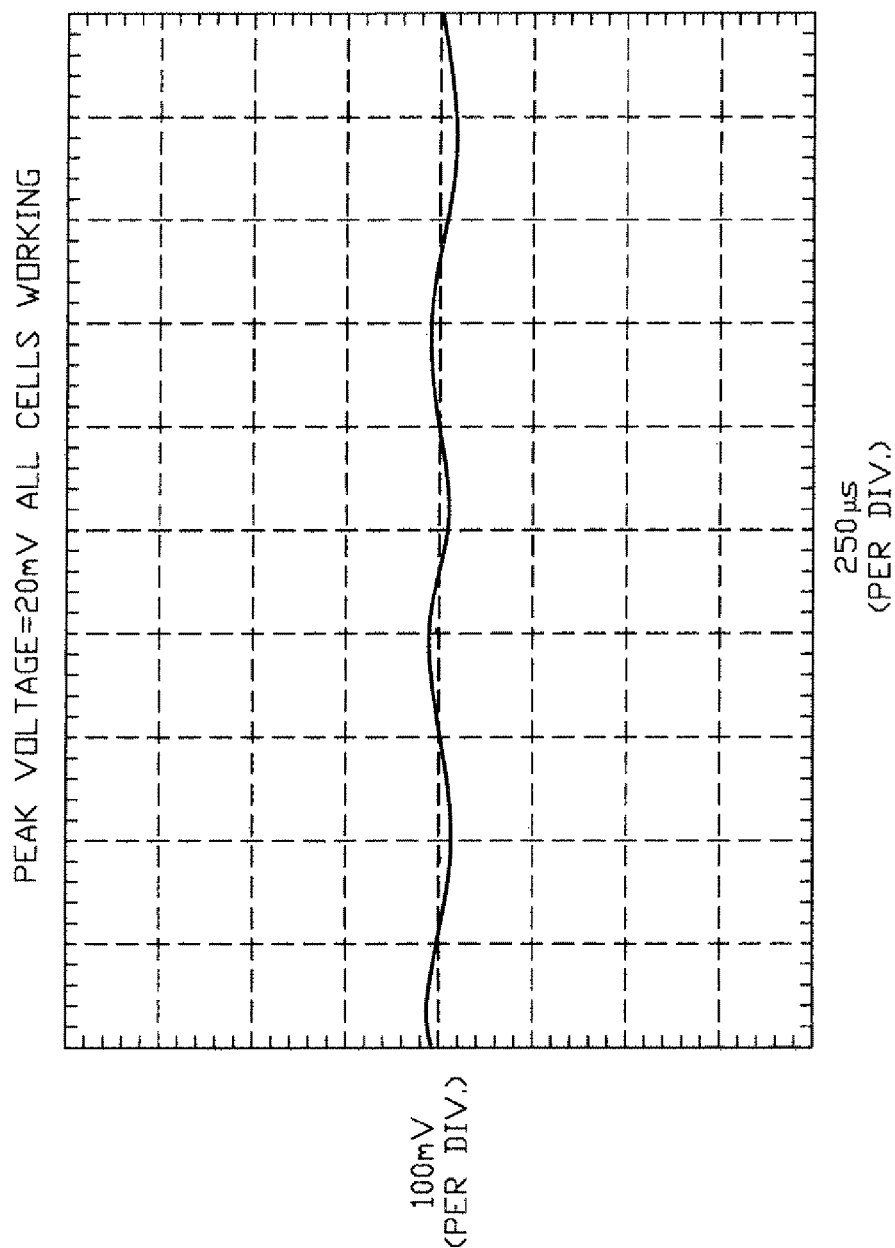
FIG. 16 is an oscilloscope measurement of the sense winding of the prototype monitoring system of FIG. 14 with all cells working and the load switch closed in accord with one possible embodiment of the present invention.
Figure 17:
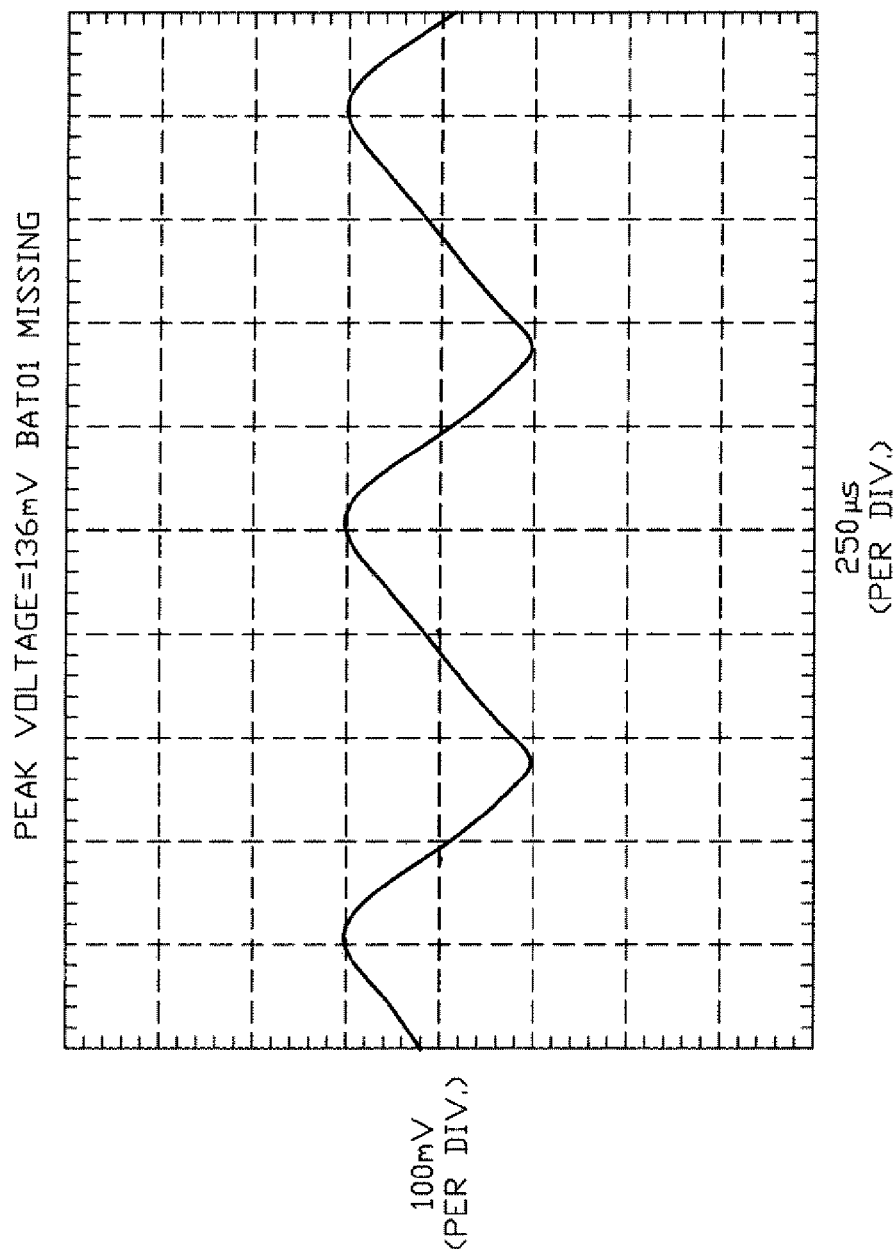
FIG. 17 is an oscilloscope measurement of the sense winding of the prototype monitoring system of FIG. 14 with cell one missing and the load switch closed to provide a peak voltage of 136 mV in accord with one possible embodiment of the present invention.
Figure 18:
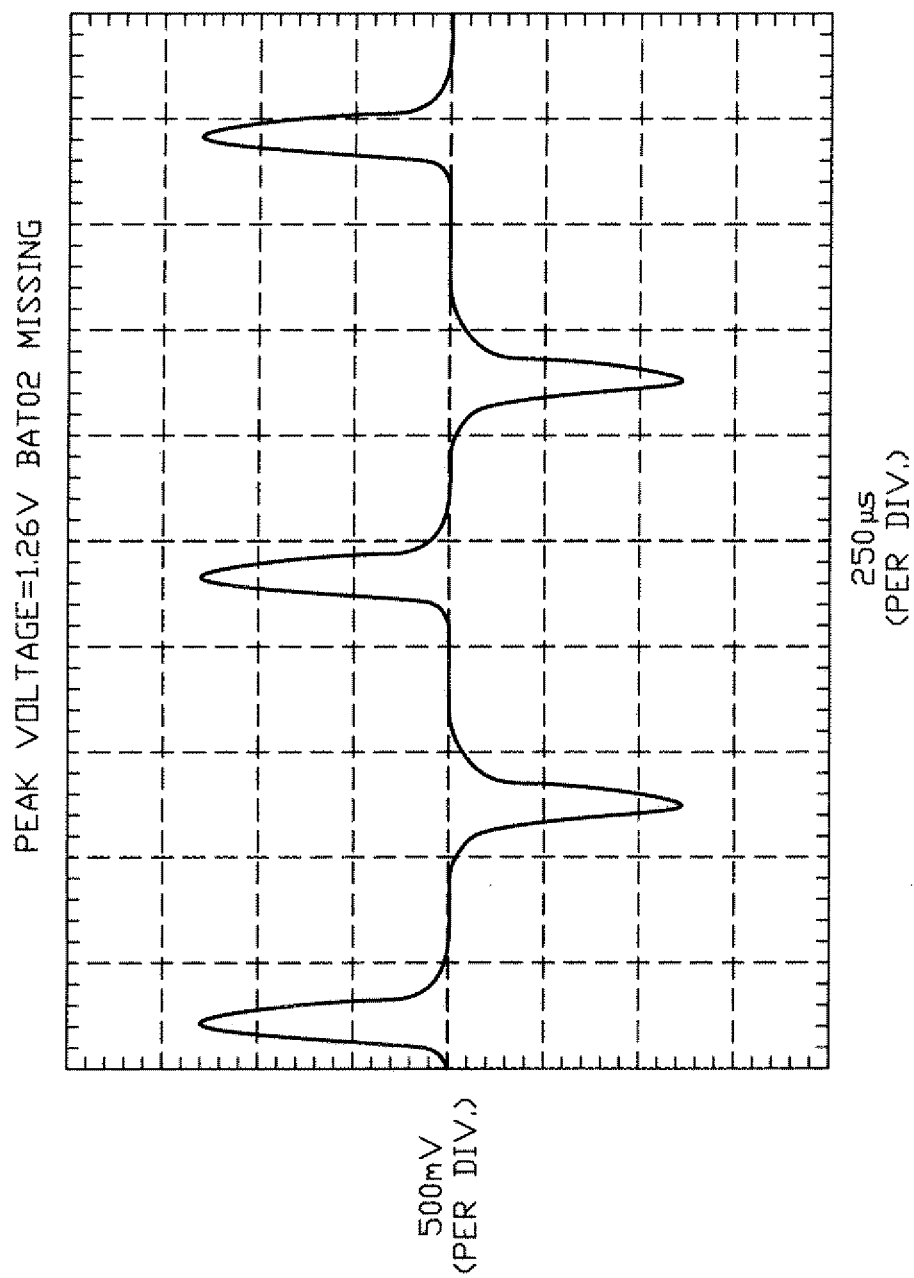
FIG. 18 is an oscilloscope measurement of the sense winding of the prototype monitoring system of FIG. 14 with cell two missing and the load switch closed to provide a peak voltage of 126 V in accord with one possible embodiment of the present invention.
Figure 19:
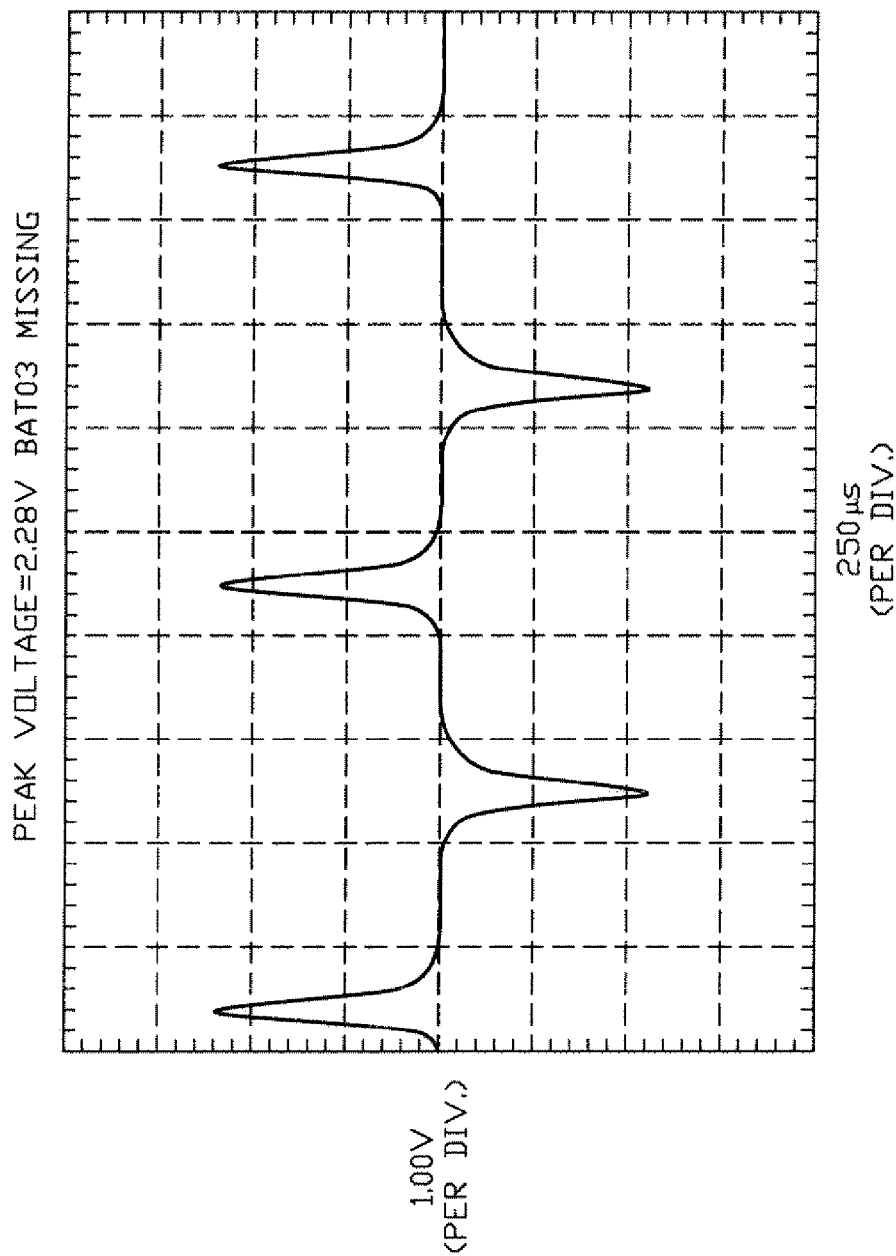
FIG. 19 is an oscilloscope measurement of the sense winding of the prototype monitoring system of FIG. 14 with cell three missing and the load switch closed to provide a peak voltage of 2.28 V in accord with one possible embodiment of the present invention.
Figure 20:
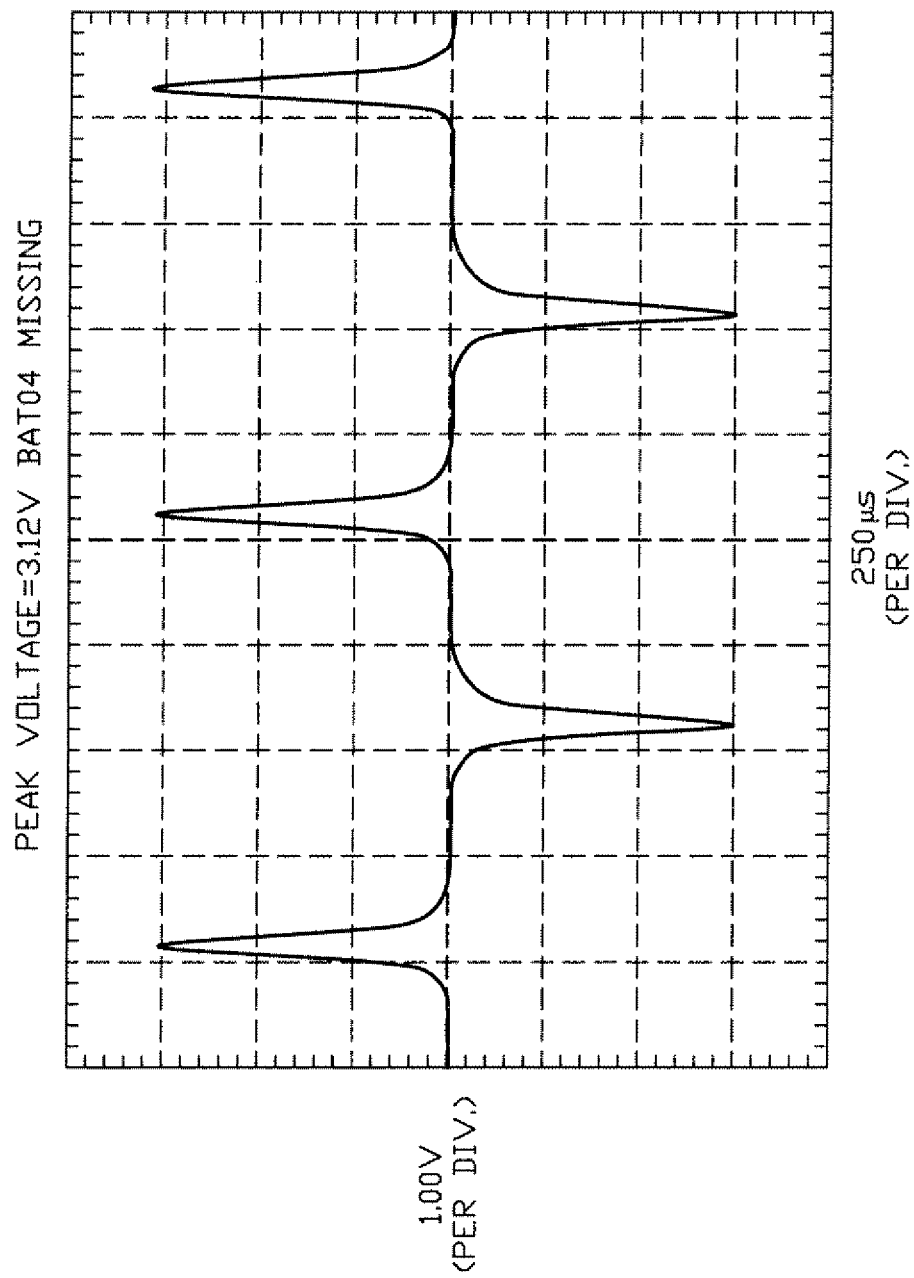
FIG. 20 is an oscilloscope measurement of the sense winding of the prototype monitoring system of FIG. 14 with cell four missing and the load switch closed to provide a peak voltage of 3.12 V in accord with one possible embodiment of the present invention.
Figure 21:
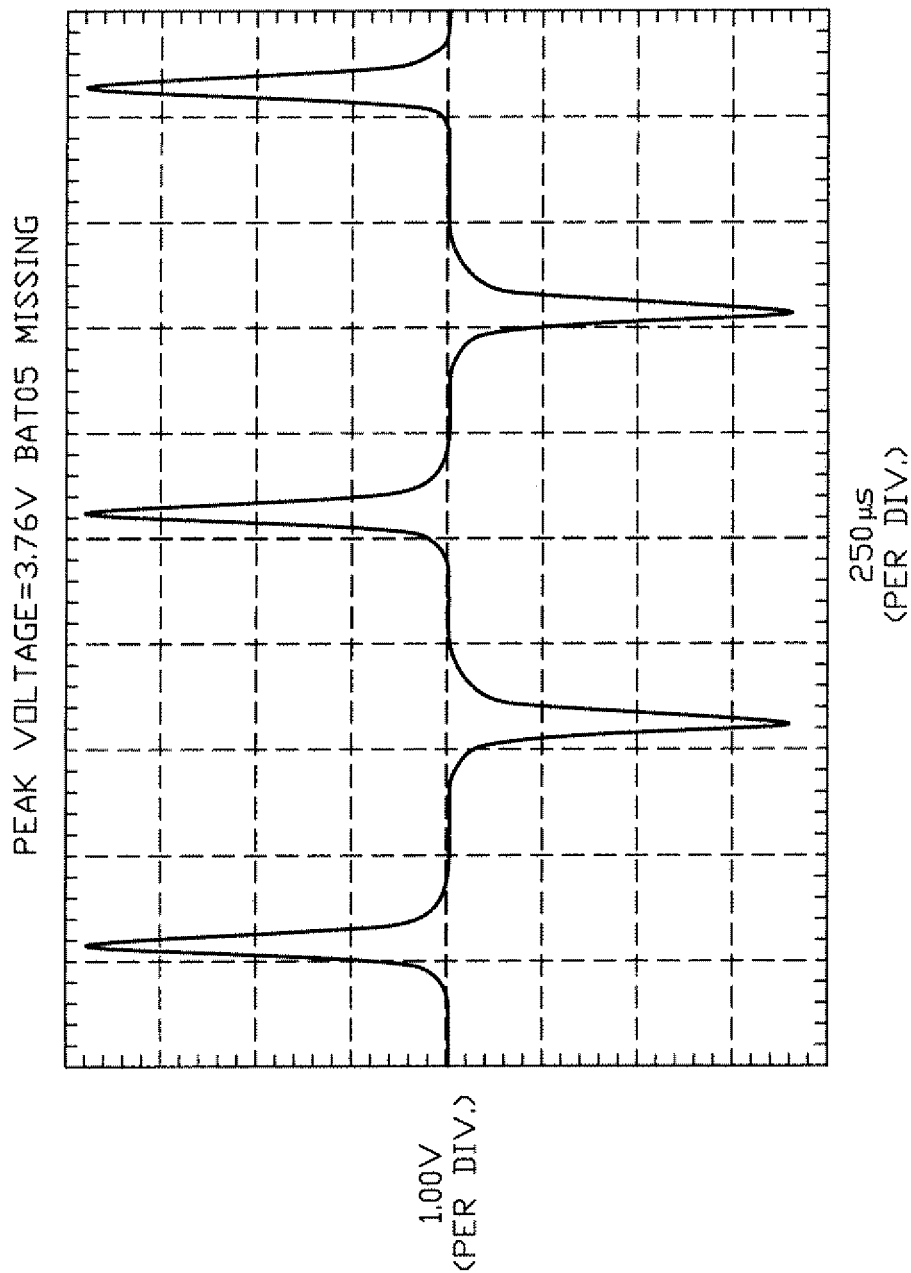
FIG. 21 is an oscilloscope measurement of the sense winding of the prototype monitoring system of FIG. 14 with cell five missing and the load switch closed to provide a peak voltage of 3.76 V in accord with one possible embodiment of the present invention.
Figure 22:
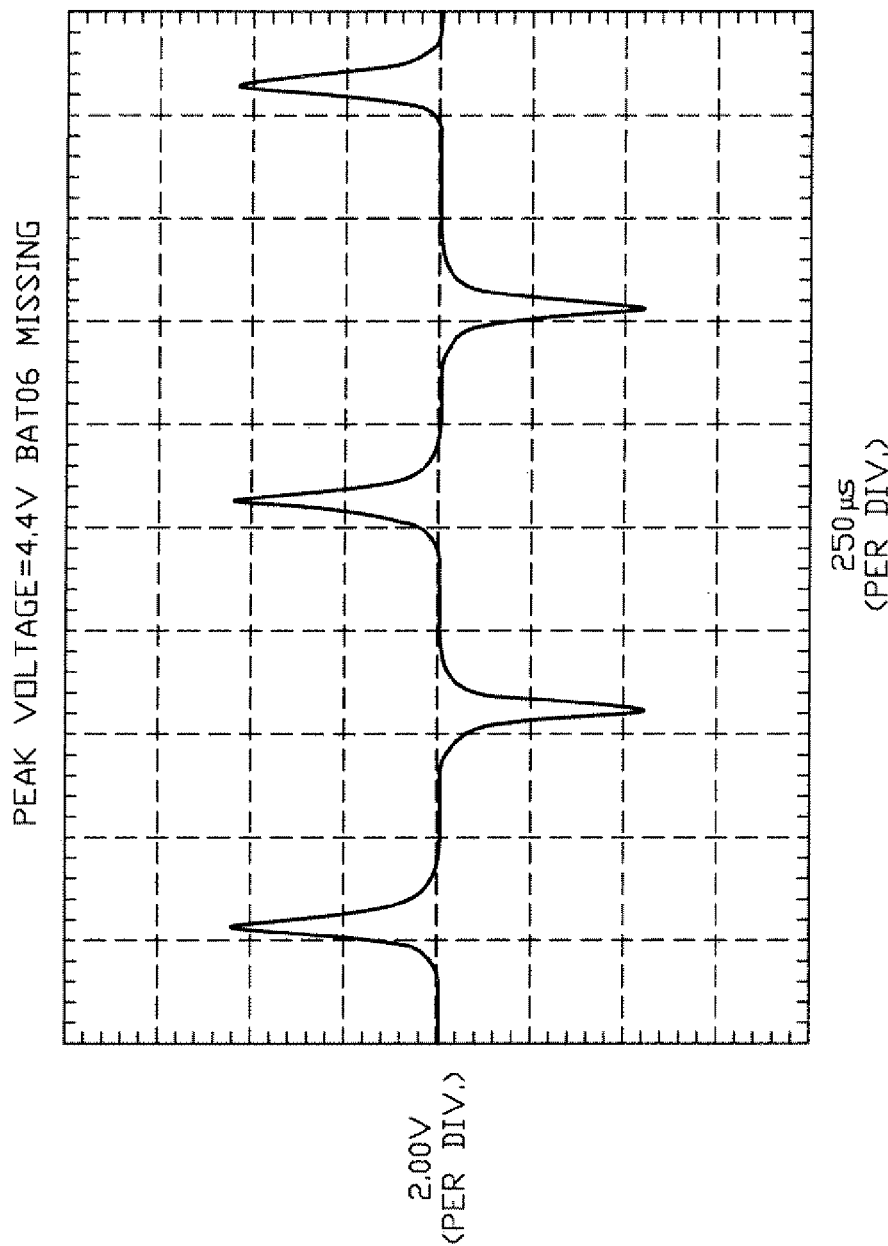
FIG. 22 is an oscilloscope measurement of the sense winding of the prototype monitoring system of FIG. 14 with cell six missing and the load switch closed to provide a peak voltage of 4.4 V in accord with one possible embodiment of the present invention.

If a battery cell is missing, this produces a peak voltage level reading on the oscilloscope that corresponds to the cell that is missing because of the unique number of windings for each cell. The following figures from oscilloscope snapshots show the peak voltage with different battery cells missing and with switch 248 closed:

| | | |
|---|---|---|
| FIG. 16 | All cells working | 20 mV |
| FIG. 17 | BAT01 missing | 136 mV |
| FIG. 18 | BAT02 missing | 1.26 V |
| FIG. 19 | BAT03 missing | 2.28 V |
| FIG. 20 | BAT04 missing | 3.12 V |
| FIG. 21 | BAT05 missing | 3.76 V |
| FIG. 22 | BAT06 missing | 4.4 V |

Looking at FIG. 16, with the oscilloscope setting to 100 mV per division, and all cells working, there is very little amplitude. The peak voltage is approximately 20 mV. However, in FIG. 17, with BAT01 missing, and BAT01 having only one turn or pass through the core, a pulse is produced that has a peak voltage of 136 mV. Thus, an operator or computer can determine that BAT01 has a problem. In this prototype system, BAT01 may be disconnected to show this effect.

BAT02 has two turns or passes through the core and therefore produces a significantly larger pulse of 1.26 peak volts when BAT02 is missing as shown in FIG. 18. Likewise the peak pulses of BAT03-BAT06 are increasingly larger due to the increasingly larger number of turns for each associated transformer. As seen in FIG. 18-22, the peak voltage continues to increase due to the increasing number of turns for each respective battery cell, so that the missing battery cell is easily discernable.

If desired, a greater difference in peak voltages for the different situations can be produced if the associate number of turns or passes through the transformer cores has a greater difference. For example, BAT02 might have three turns, BAT03 five turns, and so forth.

As discussed hereinbefore, the fact that the cores saturate means that effects of the windings on battery impedance during normal operation is minimized. When the transformer is saturated, the transformer effectively quits operating. There is virtually no effect on battery DC and low frequency impedance. It is also possible to short out the sense and/or excitation windings when the monitoring system is not utilized to further reduce impedance effects.

Figure 23:
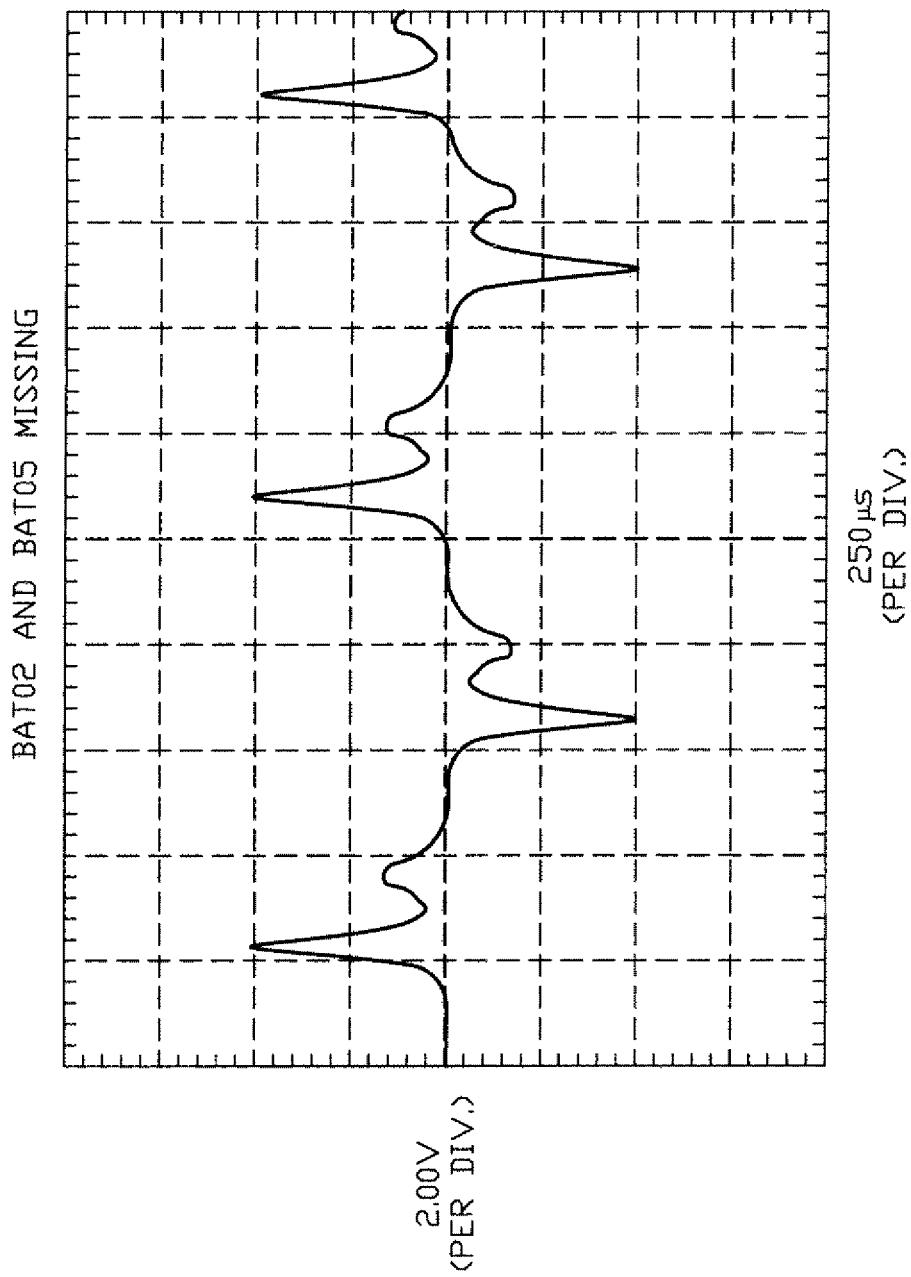
FIG. 23 is an oscilloscope measurement of the sense winding of the prototype monitoring system of FIG. 14 with cells two and five missing and the load switch closed in accord with one possible embodiment of the present invention.
Figure 24:
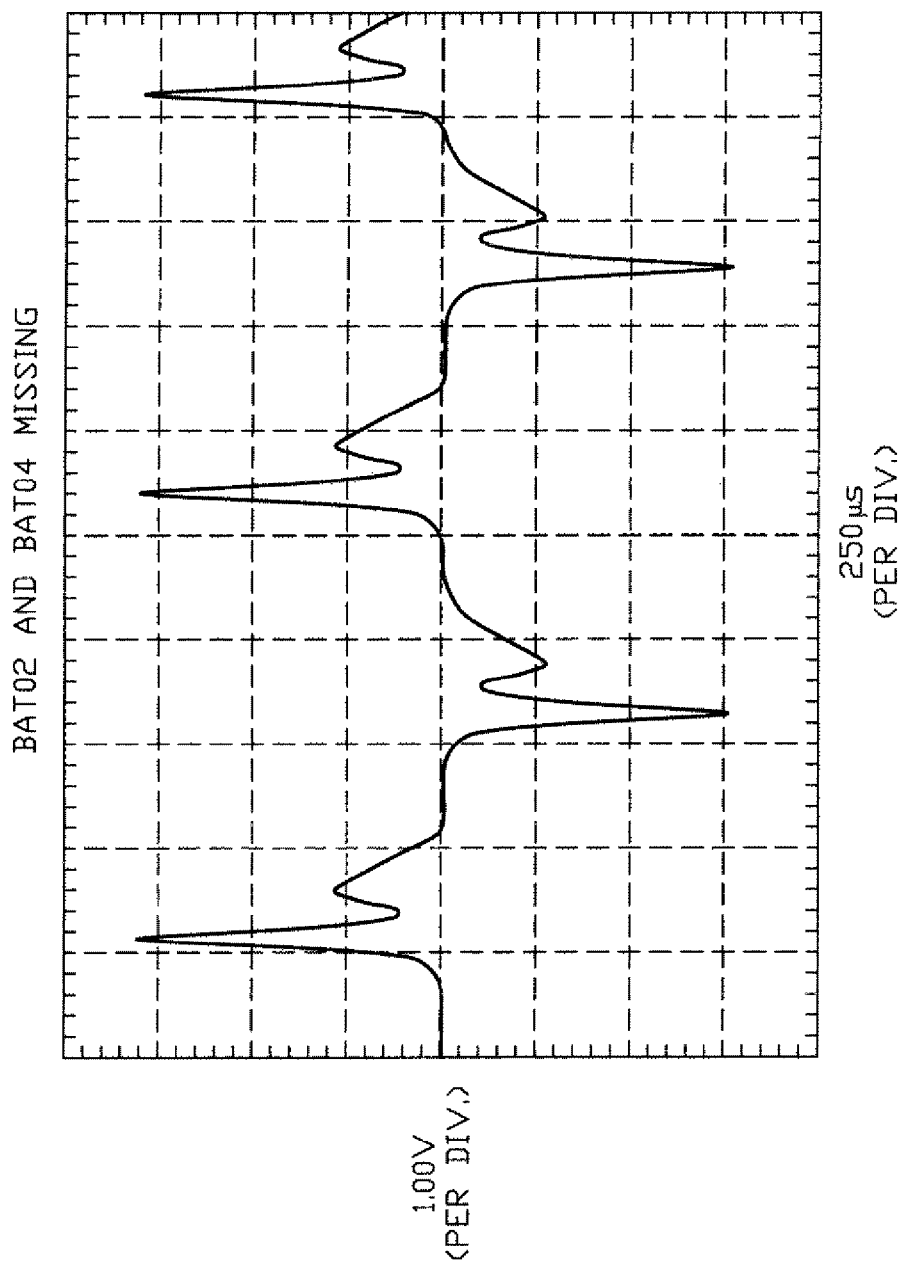
FIG. 24 is an oscilloscope measurement of the sense winding of the prototype monitoring system of FIG. 14 with cells two and four missing and the load switch closed in accord with one possible embodiment of the present invention.

FIGS. 23 and 24 show instances of two cells malfunctioning or missing, whereupon two pulses are shown where previously there was only one pulse. For example, in FIG. 23 the amplitude of the pulses indicates that BAT02 and BAT05 are missing. In FIG. 24, BAT02 and BAT04 are missing. Accordingly, this embodiment of the present invention is also able to detect the case when multiple cells are not performing correctly.

Many additional variations of the present invention are possible. For example, in FIG. 25, there is shown monitoring system 300, which in one embodiment allows the health of numerous strings of battery cells to be monitored. In this example, the battery assembly comprises strings of battery cells S1, S2, S3, S4, S5, S6, S7 and S8 wherein each string comprises nine battery cells connected in series with each other. The strings of battery cells S1-S8 are connected in parallel to each other. For each string of battery cells S1, S2, S3, S4, 55, S6, S7 and S8, corresponding battery windings provide connections with corresponding. In this embodiment, each string need be connected to only one transformer through only one battery cell of the string of battery cells.

A minimum of electronics are utilized to monitor the health of a large number of battery cells. Thus, in this example, two pins are connected to only eight batteries, whereas the remaining sixty-four batteries do not require any connections to the monitoring system.

It will be noted that the monitoring system of FIG. 12 discussed hereinbefore could also be utilized to monitor strings of battery cells instead of single battery cells whereupon any malfunctioning string could be identified. In other words, monitoring system 200 of FIG. 12 could replace monitoring system 300 in the battery assembly shown in FIG. 25 for identifying which string of battery cells malfunctions, if any.

Figure 25:
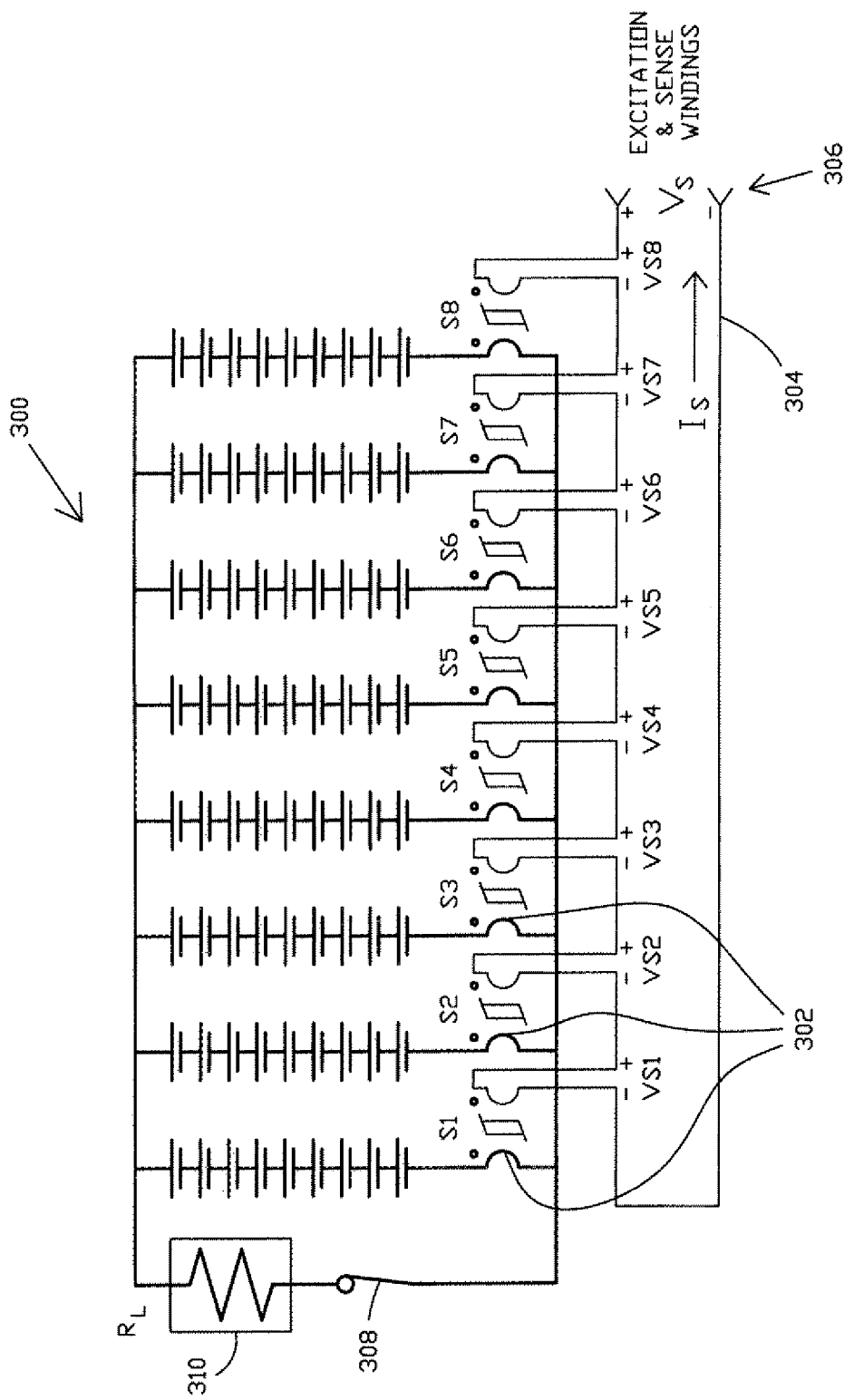
FIG. 25 is a circuit diagram showing a battery assembly comprising strings of battery cells and monitoring network which allows the health of the strings of battery cells to be monitored in accord with one possible embodiment of the present invention.

In FIG. 25, the excitation windings and the sense windings are the same. Thus, a single wire, excitation/sense wire 304, passes through or loops through each transformer core so that the coils are in series. Excitation/sense wire 304 then connects to the measurement subsystem (not shown) utilizing a simple two pin connector 306. Fuses and/or means to isolate high voltages are not necessary for two pin connector 306.

Figure 26:
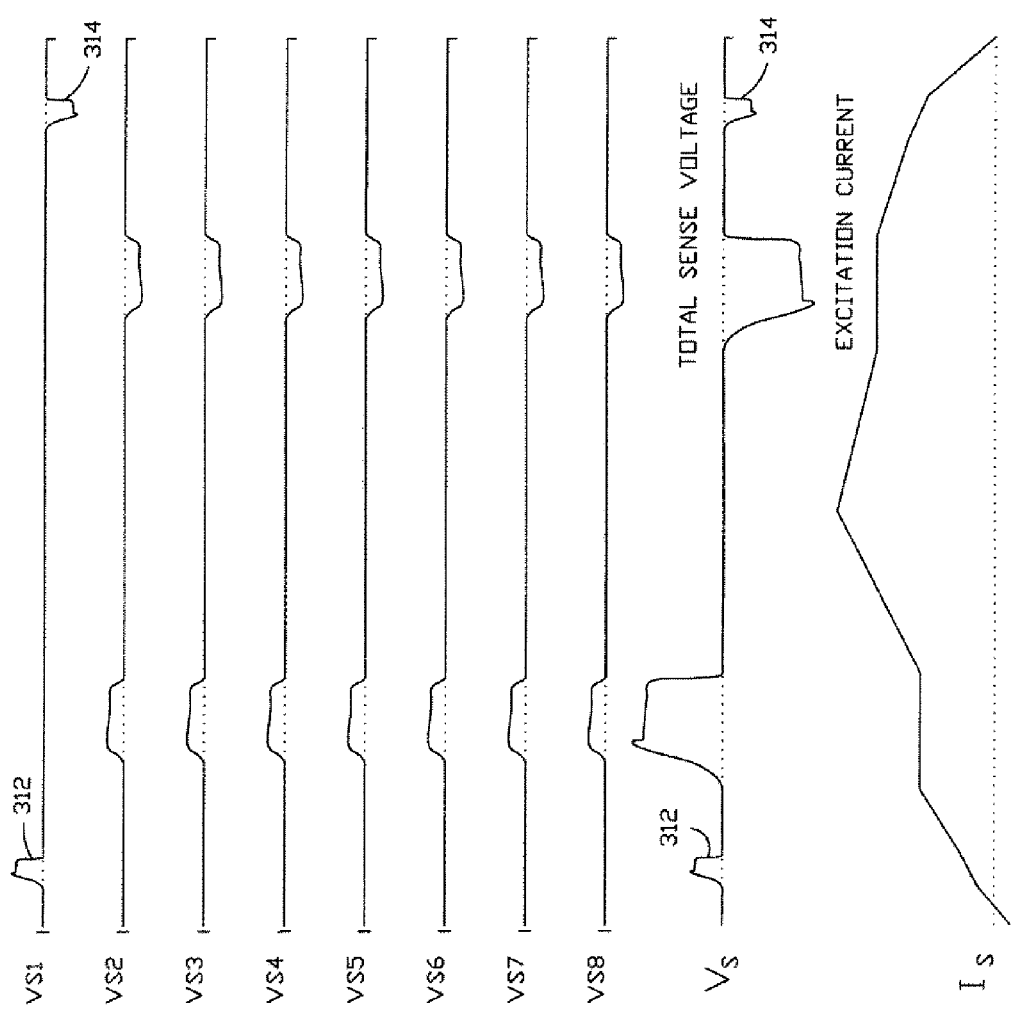
FIG. 26 is a signal diagram showing voltages and currents for the strings of battery cells of FIG. 25 which may be monitored in accord with one possible embodiment of the present invention.

In the signal waveform diagram of FIG. 26, the voltage waveforms VS1, VS2, VS3, VS4, VS5, VS6, VS7, VS8, $V_s$, and current waveform $I_s$ produced by measurement system 300 are shown. Excitation current waveform $I_s$ acts on the transformer cores to create the voltage pulses VS1-VS8. As discussed hereinbefore, the waveform may be a triangular current waveform suitable to drive the transformer cores from saturation in one direction to saturation in the other direction. When the triangular waveform is applied to the transformers with switch 308 closed to known load 310, the resulting somewhat distorted excitation current waveform $I_s$ is produced.

The composite signal of waveforms VS1, VS2, VS3, VS4, VS5, VS6, VS7, and VS8 is measured as $V_s$. From $V_s$, in this example, it can be determined that one of the strings of battery cells is malfunctioning due to error pulses 312 and 314. If the particular voltages VS1-VS8 are viewed, then the particular malfunctioning battery string, in this case Si, can be detected, although this would require additional connections. As another alternative, the strings could be divided into banks of strings whereby separate sense/excitation windings could be utilized on each bank. For example, the use of two sense/excitation windings could distinguish between faults on bank S1-S4 and bank S5-S8. As another alternative, different numbers of windings could be utilized, whereby with simple two pin connector 306 for the measurement subsystem (not shown), the faulty string could be located.

Figure 27:
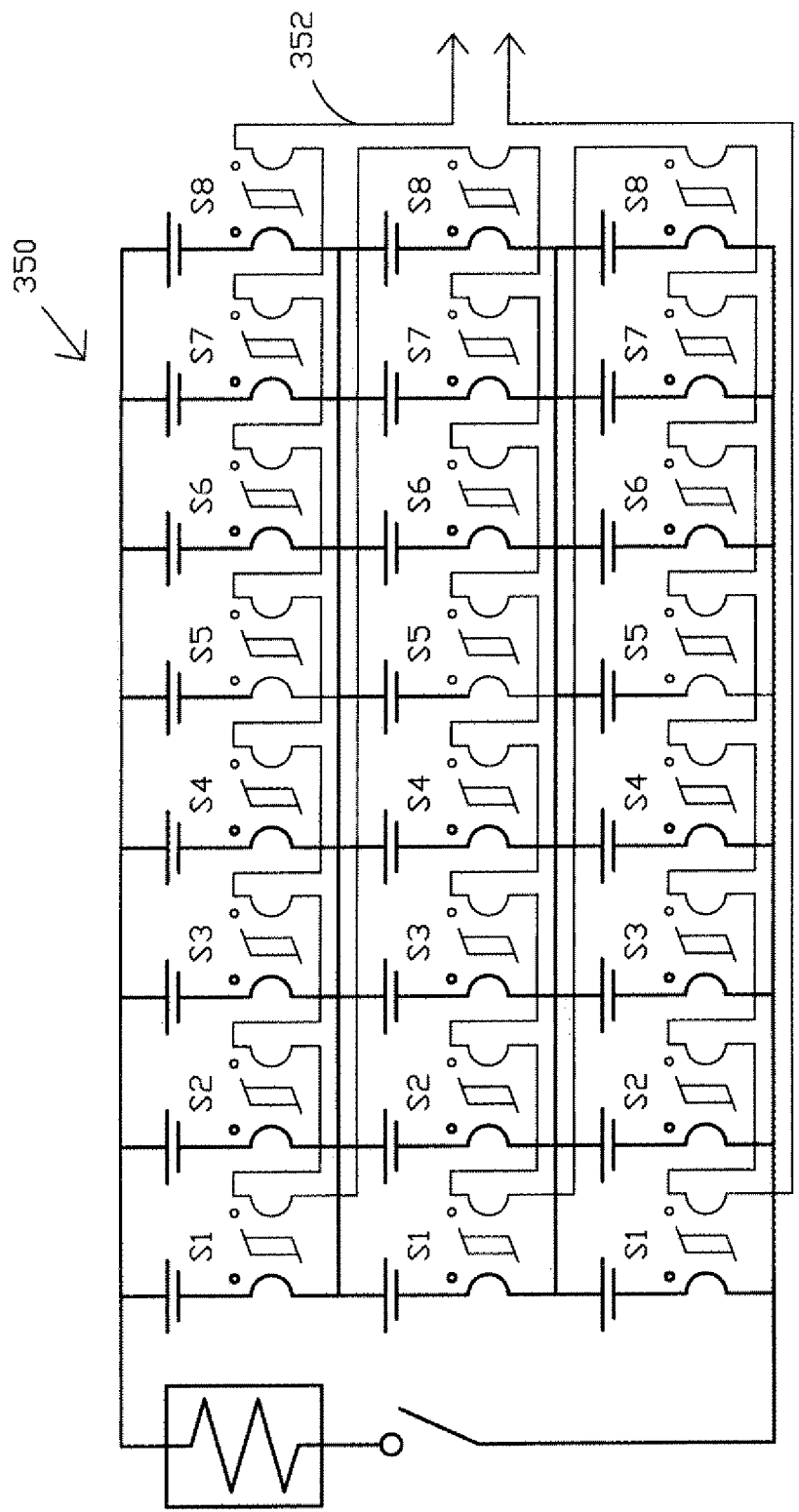
FIG. 27 is a circuit diagram showing a battery comprising series banks of parallel cells and monitoring network which allows the health of the battery cells to be monitored in accord with one possible embodiment of the present invention.

Another possible embodiment of the invention, shown in FIG. 27, comprises monitoring system 350 that utilizes a single excitation/sense wire 352 to monitor a battery assembly comprised of series banks of parallel battery cells. However, it will be understood that each battery cell symbol may also represent a string of battery cells. In this embodiment, each battery cell is connected to a respective transformer and excitation/sense wire 352 passes through or wraps around each transformer core one time. If desired, variations in the number of wraps could be utilized to distinguish which cells have faults, as discussed hereinbefore.

Accordingly, many different battery assembly configurations can be monitored by the present invention. Moreover, faulty operation of individual battery cells or groups of battery cells can be detected and, if desired, located.

Figure 28:
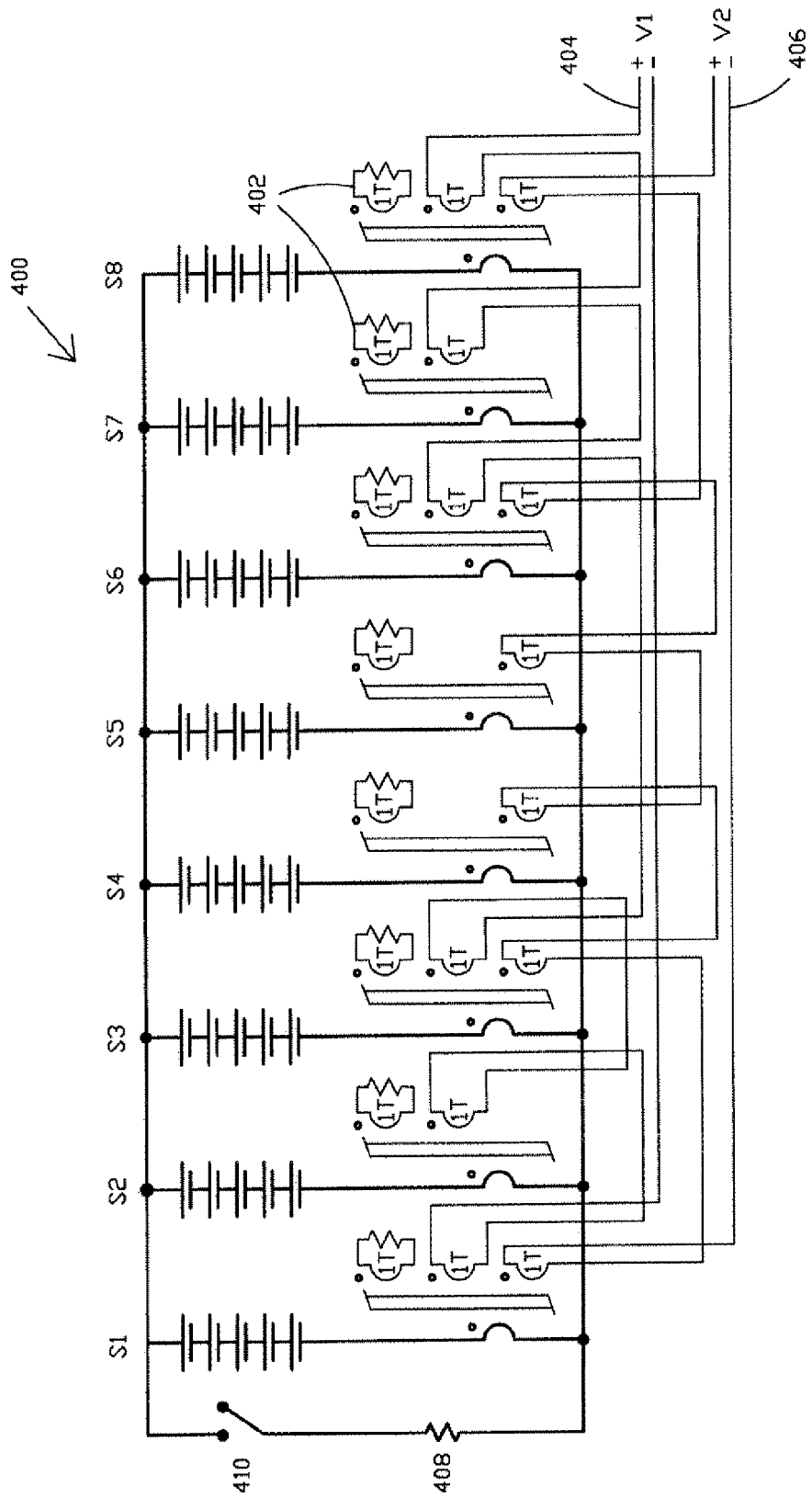
FIG. 28 is a circuit diagram showing a battery comprising strings of battery cells and monitoring network which allows the health of the strings of battery cells to be monitored in accord with one possible embodiment of the present invention.

FIG. 28 provides yet another possible embodiment of the present invention wherein monitoring system 400 is utilized to monitor strings S1-S8 of battery cells. If a fault occurs, then monitoring system 400 is operable to detect which string of battery cells in which the fault occurs. In this embodiment of the invention, current transformer types of windings are provided whereby windings 402 comprise a resistor connected to a winding. However, the current transformer configuration shown in this embodiment is not required and is shown here as example of a different type of transformer winding configuration that may be utilized in this embodiment of the invention or in other embodiments.

As a result of applying connecting a test load 408 to the battery with switch 410, a current will flow through all the transformers that are connected to properly functioning strings. Positive and negative voltages are detected which can be utilized to locate the battery cell string in which the fault occurred as indicated by the chart in FIG. 29. It will be noted that the direction of the windings varies with different transformers, whereby both positive and/or negative pulses are produced, if there is a fault. Moreover, the excitation/sense wires connect to a different arrangement of transformers.

If there is no fault, the voltage pulse on a sense winding will cancel out. Or, if a wire does not run through a transformer which is connected to a faulty battery cell, then pulses will not be produced. Accordingly, there are three possible readings for both V1 and V2, namely, a positive pulse, a negative pulse, or no pulse. This gives rise to nine possible outcomes utilizing two excitation/sense wires. The nine possible outcomes are shown in the battery assembly diagnosis chart of FIG. 29.

For the no fault condition shown in the chart of FIG. 29, during normal operation of monitoring system 400, the pulses produced by the excitation signal will cancel each other. However, if there is a fault, depending on which group of battery strings in which the fault is located, then the pulses produced on excitation/sense wires 404 and 406 will not cancel. In this example, the use of two excitation/sense windings permits identification of the string in which the fault occurs for eight strings of battery cells.

It will be appreciated that with an additional sense/excitation wire twenty-seven possibilities can be achieved or the number of sense/excitation wires cubed. Additional variations to distinguish faulty battery cells or groups of battery cells, the number of turns in the windings may be varied, as discussed hereinbefore.

As well, the sense and excitation wires can be separated as shown hereinbefore in FIG. 12, which reduces the effects of wire impedance on measurements, allows resistive pads to match impedance to retain signal integrity over long cable runs, and limits the effects of transformers on battery impedance.

While a few exemplary embodiments of this invention have been described in detail above, a person skilled in the art will readily appreciate that many modifications are possible in the exemplary embodiments without materially departing from the novel teachings and advantages of this invention. Accordingly, all such modifications are intended to be included within the scope of this invention as defined in the following claims. In the claims, any means-plus-function and step-plus-function clauses are intended to cover the structures or acts described herein as performing the recited function and not only structural equivalents, but also equivalent structures. Thus, although a nail and a screw may not be structural equivalents in that a nail employs a cylindrical surface to secure wooden parts together, whereas a screw employs a helical surface, in the environment of fastening wooden parts, a nail and a screw may be equivalent structures.

What is claimed is:

1. An apparatus to monitor a plurality of battery cells, said plurality of battery cells being operably connected to each other, comprising:
    a plurality of transformers;
    a plurality of battery windings operably associated with said plurality of transformers wherein said plurality of battery cells is operably connected to said plurality of battery windings;
    a plurality of first windings operably associated with said plurality of transformers;
    at least one waveform generator capable of producing a waveform, wherein said at least one waveform generator is operably connected to said plurality of first windings, wherein said plurality of first windings is capable of receiving said waveform;
    a plurality of saturable transformer operably associated said plurality of transformers, said waveform being operable to drive said plurality of saturable transformer cores from being magnetically saturated in one direction saturated in an opposite direction; and
    at least one signal detector operably connected with said plurality of transformers to detect a signal produced by said plurality of transformers responsively to said waveform to thereby monitor said plurality of battery cells,
wherein said plurality of saturable transformers cores are magnetically saturated by said waveform in a predetermined direction.

2. The apparatus of claim 1, further comprising a plurality of second windings operably associated with said plurality of transformers wherein said at least one signal detector is operably connected to said plurality of second windings.

3. The apparatus of claim 2, wherein said plurality of second windings comprise a predetermined different numbers of turns for a predetermined plurality of transformers.

4. The apparatus of claim 3, wherein said at least one signal detector is operable for detecting peak voltages of said signal to distinguish between said plurality of battery cells for underperformance of said plurality of battery cells.

5. The apparatus of claim 4, wherein each of said plurality of second windings comprises a unique number of turns relative to each other.

6. The apparatus of claim 2, wherein said plurality of second windings for said plurality of transformers are connected in series with each other.

7. The apparatus of claim 1, wherein said plurality of first windings for said plurality of transformers are connected in series with each other.

8. The apparatus of claim 1, further comprising a plurality of interconnections between said plurality of battery cells which electrically connect at least a portion of said battery cells in parallel with each other.

9. The apparatus of claim 1, further comprising a plurality of interconnections between said plurality of battery cells which electrically connect at least a portion of said plurality of battery cells in series with each other.

10. The apparatus of claim 1, further comprising four connections or less to electrically connect to each of said plurality of transformers and to said at least one waveform generator and said at least one signal detector.

11. The apparatus of claim 1, further comprising two connections or less to electrically connect to each of said plurality of transformers and to said at least one waveform generator and said at least one signal detector.

12. A method for monitoring a plurality of battery cells comprising the steps of:
providing a plurality of transformers comprising a plurality of battery windings and a plurality of first windings;
electrically connecting a said plurality of transformers to said plurality of battery cells comprising electrically connecting said plurality of battery windings to said plurality of battery cells;
electrically connecting at least one waveform generator to said plurality of transformers comprising electrically connecting said waveform generator to said plurality of first windings to produce a waveform in said plurality of transformers;
utilizing said waveform to drive a plurality of saturable cores operably associated with said plurality of transformers from being magnetically saturated in one direction to being magnetically saturated in an opposite direction; and
detecting a signal in said plurality of transformers responsively to said waveform indicative of at least one underperforming battery cell within said plurality of battery cells.

13. The method of claim 12, further comprising providing a plurality of second windings operably associated with said plurality of transformers and wherein said step of detecting a signal further comprises electrically connecting a signal detector to said plurality of second windings.

14. The method of claim 13, further comprising the step of varying a number of turns of said plurality of second windings operably associated with said plurality of transformers to locate said at least one underperforming battery cell within said plurality of battery cells.

15. An apparatus to monitor a plurality of battery cells, said plurality of battery cells being operably connected to each other, comprising:
a plurality of transformers operably associated with a plurality of battery windings and operably connected to said plurality of battery cells wherein said plurality of battery cells is operably connected to said plurality of battery windings;
a plurality of first windings operably associated with said plurality of transformers;
at least one waveform generator capable of producing a waveform, wherein said plurality of first windings is operably connected to said at least one waveform generator;
a plurality of saturable transformer cores operably associated with said plurality of transformers, said waveform being operable to drive said plurality of saturable transformer cores from being magnetically saturated in one direction to being magnetically saturated in an opposite direction; and
at least one signal detector connected with said plurality of transformers, wherein said at least one signal detector is capable of detecting at least one underperforming battery cell within said plurality of battery cells,
wherein said plurality of saturable transformers cores are magnetically saturated by said waveform in a predetermined direction.

16. The apparatus of claim 15, further comprising a plurality of second windings operably associated with said plurality of transformers wherein said at least one signal detector is operably connected to said plurality of second windings, said plurality of second windings comprising different numbers of turns for different of said plurality of transformers.

17. The apparatus of claim 15, further comprising a plurality of transformer cores operably associated with said plurality of transformers, wherein each transformer core has a mass of less than 10 grams.

* * * * *